United States Patent
Matsutera et al.

(10) Patent No.: US 7,068,536 B2
(45) Date of Patent: Jun. 27, 2006

(54) MAGNETIC RANDOM ACCESS MEMORY, AND PRODUCTION METHOD THEREFOR

(75) Inventors: Hisao Matsutera, Minato-ku (JP); Tetsuhiro Suzuki, Minato-ku (JP)

(73) Assignee: NEC Corporation, Tokyo (JP)

( * ) Notice: Subject to any disclaimer, the term of this patent is extended or adjusted under 35 U.S.C. 154(b) by 78 days.

(21) Appl. No.: 10/496,827

(22) PCT Filed: Oct. 23, 2003

(86) PCT No.: PCT/JP03/13522

§ 371 (c)(1),
(2), (4) Date: May 27, 2004

(87) PCT Pub. No.: WO2004/040651

PCT Pub. Date: May 13, 2004

(65) Prior Publication Data

US 2005/0002229 A1    Jan. 6, 2005

(30) Foreign Application Priority Data

Oct. 31, 2002    (JP) ............................. 2002-317527

(51) Int. Cl.
*G11C 7/00*    (2006.01)
(52) U.S. Cl. ....................................... 365/171; 365/158
(58) Field of Classification Search ................ 365/171, 365/158, 145
See application file for complete search history.

(56) References Cited

U.S. PATENT DOCUMENTS

| 6,252,796 B1 | 6/2001 | Lenssen et al. |
| 6,396,735 B1 | 5/2002 | Michijima et al. |

(Continued)

FOREIGN PATENT DOCUMENTS

EP    1187103 A2    3/2002

(Continued)

OTHER PUBLICATIONS

K. Tsuji, et al. "0.1 μm-rule MRAM Development using Double-Layered Hard Mask" 2001 International Electron Devices Meeting Technical Digest, IEEE, 2001, pp. 799 to 802.

(Continued)

*Primary Examiner*—Vu A. Le
(74) *Attorney, Agent, or Firm*—Sughrue Mion, PLLC

(57) ABSTRACT

In an aspect of the present invention, a magnetic random access memory includes a substrate, a MTJ (Magnetic tunnel Junction) device formed above the substrate, a first wiring line formed above the substrate, and a second wiring line formed above the substrate. The MTJ device includes a pinned ferromagnetic layer which has a pinned magnetization, a free ferromagnetic lamination layer, and a tunnel barrier layer interposed between the pinned ferromagnetic layer and the free ferromagnetic lamination layer. The free ferromagnetic lamination layer includes a first ferromagnetic layer coupled to the tunnel barrier layer and having a reversible first magnetization, a second ferromagnetic layer which has and a second magnetization whose direction is opposite to a direction of the first magnetization, the second magnetization being reversible, and a non-magnetic conductive layer provided between the first ferromagnetic layer and the second ferromagnetic layer and having a sheet resistance lower than sheet resistances of the first ferromagnetic layer and the second ferromagnetic layer. A write current is supplied the free ferromagnetic lamination layer through one of the first wiring line and the second wiring line to reverse the first magnetization and the second magnetization, and the other of the first wiring line and the second wiring line receives the supplied write current from the free ferromagnetic lamination layer.

17 Claims, 12 Drawing Sheets

U.S. PATENT DOCUMENTS

| | | | |
|---|---|---|---|
| 6,737,691 B1 * | 5/2004 | Asao | 257/295 |
| 6,944,049 B1 * | 9/2005 | Hoenigschmid et al. | 365/158 |

FOREIGN PATENT DOCUMENTS

| | | |
|---|---|---|
| JP | 04-255905 A | 9/1992 |
| JP | 10-255231 A | 9/1998 |
| JP | 11-161919 A | 6/1999 |
| JP | 2001-052316 A | 2/2001 |
| JP | 2002-124718 A | 4/2002 |
| JP | 2002-141583 A | 5/2002 |
| JP | 2002-176211 A | 6/2002 |
| JP | 2002-204002 A | 7/2002 |
| JP | 2003-86866 A | 3/2003 |
| JP | 2003-209226 A | 7/2003 |
| JP | 2004-119903 A | 4/2004 |

OTHER PUBLICATIONS

U.S. Appl. No. 10/873,269.

* cited by examiner

MAGNETIC RANDOM ACCESS MEMORY, AND PRODUCTION METHOD THEREFOR

TECHNICAL FIELD

The present invention relates to a magnetic random access memory, and more particularly to a magnetic random access memory utilizing a magnetic tunnel junction (MTJ) device which shows a tunnel magneto-resistance effect (TMR effect) as a memory cell.

BACKGROUND ART

A magnetic tunnel junction (MTJ) is composed of two ferromagnetic material layers and a tunnel barrier layer (a tunnel insulating layer) put between these ferromagnetic material layers, and the resistance changes largely, depending on the relative directions of the magnetizations of the ferromagnetic material layers. Such a phenomenon is called a tunnel magneto-resistance effect (TMR effect). By detecting the resistance of the magnetic tunnel junction, the direction of the magnetization of the ferromagnetic material layer can be determined. A magnetic random access memory (MRAM) which can hold data in a non-volatile manner is known as a magneto-resistance device using the property of the magnetic tunnel junction.

Memory cells, each of which contains the MTJ are arranged in a matrix in the MRAM. Of two ferromagnetic layers contained in the MTJ, the direction of magnetization of one ferromagnetic layer (called a pinned ferromagnetic layer) is fixed and the direction of magnetization of the other (called a free ferromagnetic layer) is reversible. Data is stored as the direction of magnetization of the free ferromagnetic layer. A write operation of the data is carried out by supplying a current to the neighborhood of the magnetic tunnel junction to reverse the direction of magnetization of the free ferromagnetic layer by a magnetic field generated by the current. A read operation of the data is carried out by detecting the direction of the magnetization of the free ferromagnetic layer by utilizing the TMR effect.

In the MRAM, it is demanded to realize the write operation of the data (i.e., the reversal of the direction of magnetization) in a small current. On the other hand, in order to hold the data stably, the direction of magnetization of the free ferromagnetic layer is demanded to be stable against thermal disturbance. However, they are generally discrepant from each other. For example, when the coercive force of the free ferromagnetic layer is made small, that is, when an anisotropic magnetic field of the free ferromagnetic layer is made small, the direction of the magnetization can be reversed in a small current. However, the decrease of the anisotropic magnetic field is generally accompanied by the reduction of an energy barrier to prevent the reversal of the direction of magnetization of the free ferromagnetic layer. Therefore, when the anisotropic magnetic field decreases, the MRAM cannot hold the data stably.

U.S. Pat. No. 6,396,735 discloses an MRAM in which the reduction of a write current and the stabilization of data holding are realized at a time. This conventional MRAM contains a magnetic memory device 101a as shown in FIG. 1. The magnetic memory device 101a is composed of a wiring layer 128, an insulating layer 127, an anti-ferromagnetic layer 111, a pinned ferromagnetic layer 112, an insulating layer 113, a free ferromagnetic layer 114, a wiring layer 115 and a ferromagnetic layer 116. The pinned ferromagnetic layer 112 is composed of ferromagnetic layers 120 and 122 and a metal layer 121 put between them. As shown in FIG. 2, the wiring layer 115 extends in parallel to the substrate.

In the MRAM shown in FIG. 1, a write operation of data is carried out by supplying a write current to the wiring layer 115 into a direction parallel to the substrate. When the write current flows through the wiring layer 115, a magnetic field is applied to the free ferromagnetic layer 114 and the ferromagnetic layer 116 so that the directions of the magnetizations of the free ferromagnetic layer 114 and ferromagnetic layer 116 are reversed. Because the direction of the magnetic field applied to the free ferromagnetic layer 114 is opposite to the direction of the magnetic field applied to the ferromagnetic layer 116, the direction of magnetization of the free ferromagnetic layer 114 is opposite to the direction of magnetization of the ferromagnetic layer 116. Because the distance between the wiring layer 115 through which the write current flows and the free ferromagnetic layer 114 or the ferromagnetic layer 116 is short, it is possible to reverse the direction of magnetization in a little current. On the other hand, because the directions of the magnetizations are opposite to each other when the write current does not flow so that the free ferromagnetic layer 114 and the ferromagnetic layer 116 are combined magnetostatically. Therefore, the directions of the magnetizations of the free ferromagnetic layer 114 and ferromagnetic layer 116 are stable against external disturbance. The technique similar to the technique disclosed in U.S. Pat. No. 6,396,735 is disclosed in U.S. Pat. No. 6,252,796.

In order to stabilize the directions of magnetizations of the free ferromagnetic layer 114 and ferromagnetic layer 116 when the write operation is not carried out, it is preferable that the distance between the free ferromagnetic layer 114 and the ferromagnetic layer 116 is short. The distance between the free ferromagnetic layer 114 and the ferromagnetic layer 116 can be made small by thinning the wiring layer 115. However, when the wiring layer 115 is thinned, the resistance of a path through which the write current flows increases. The increase of the resistance of the write current path is not preferable because it increases power consumption and a delay time.

It is demanded that it is possible to decrease the resistance of the write current path while the direction of the magnetization of the free ferromagnetic layer is further stabilized in case of a non-write operation.

In conjunction with the above description, a magnetic tunnel junction device is disclosed in Japanese Laid Open Patent Application (JP-A-Heisei 11-161919). The magnetic tunnel junction device of this conventional example contains a pinned ferromagnetic multiple layer, a free ferromagnetic multiple layer and an insulation tunnel layer. The pinned ferromagnetic multiple layer has a magnetic moment fixed in a desired direction under application of a magnetic field, and contains first and second ferromagnetic films which are combined anti-ferromagnetically with each other, and an anti-ferromagnetic coupling film arranged to contact the first and second ferromagnetic films. The free ferromagnetic multiple layer has a freely reversible magnetic moment under application of a magnetic field and contains first and second ferromagnetic films which are combined anti-ferromagnetically with each other, and an anti-ferromagnetic coupling film arranged to contact the first and second ferromagnetic films. The insulation tunnel layer is arranged to contact the pinned ferromagnetic multiple layer and the free ferromagnetic multiple layer to permit a tunnel current between the pinned ferromagnetic multiple layer and of the free ferromagnetic multiple layer.

Also, a magneto-resistance effect device is disclosed in Japanese Laid Open Patent Application (JP-P2002-141583A). The magneto-resistance effect device of this conventional example is composed of a free layer, a non-magnetic layer, and a pinned layer. A current flows between the free layer and the pinned layer through the non-magnetic layer, and a vertical bias layer is provided to contact the free layer. The vertical bias layer is formed for the lower surface of the free layer to have a plane contact with the upper surface of the vertical bias layer or for the upper surface of the free layer to have a plane contact with the lower surface of the vertical bias layer.

DISCLOSURE OF INVENTION

Therefore, an object of the present invention is to provide an MRAM, which can decrease the resistance of a path through which a write current flows while the direction of magnetization of a free ferromagnetic layer can be held in case of a non-write operation.

Another object of the present invention is to provide an MRAM in which it is possible to write data in a small write current.

In an aspect of the present invention, a magnetic random access memory includes a substrate, a MTJ (Magnetic tunnel Junction) device formed above the substrate, a first wiring line formed above the substrate, and a second wiring line formed above the substrate. The MTJ device includes a pinned ferromagnetic layer which has a pinned magnetization, a free ferromagnetic lamination layer, and a tunnel barrier layer interposed between the pinned ferromagnetic layer and the free ferromagnetic lamination layer. The free ferromagnetic lamination layer includes a first ferromagnetic layer coupled to the tunnel barrier layer and having a reversible first magnetization, a second ferromagnetic layer which has and a second magnetization whose direction is opposite to a direction of the first magnetization, the second magnetization being reversible, and an on-magnetic conductive layer provided between the first ferromagnetic layer and the second ferromagnetic layer and having a sheet resistance lower than sheet resistances of the first ferromagnetic layer and the second ferromagnetic layer. A write current is supplied the free ferromagnetic lamination layer through one of the first wiring line and the second wiring line to reverse the first magnetization and the second magnetization, and the other of the first wiring line and the second wiring line receives the supplied write current from the free ferromagnetic lamination layer.

Here, it is desirable that the film thickness of the non-magnetic conductive layer is different from at least one of film thicknesses of the first wiring line and the second wiring line. Especially, it is desirable that both of the film thicknesses of the first wiring line and the second wiring line are thicker than the film thickness of the non-magnetic conductive layer.

Also, the first wiring line may supply the write current to the free ferromagnetic lamination layer from a first side of the free ferromagnetic lamination layer, and the second wiring line may receive the write current from a second side of the free ferromagnetic lamination layer.

Also, the first wiring line may supply the write current to the non-magnetic conductive layer through a current supply surface of the free ferromagnetic lamination layer which is provided on a side opposite to the tunnel barrier layer, and the write current may flow into the second wiring line from the non-magnetic conductive layer through the current supply surface.

In this case, the magnetic random access memory may further include a local wiring layer covering a whole surface of the free ferromagnetic lamination layer. It is desirable that the first wiring line and the second wiring line are formed on the local wiring layer, and a sheet resistance of the local wiring layer is higher than the sheet resistances of the non-magnetic conductive layer, the first ferromagnetic layer and the second ferromagnetic layer.

Also, the magnetic random access memory may further include an oxide region interposed between the first wiring line and the second wiring line. It is desirable that the first wiring line, the second wiring line and the oxide region are directly coupled to the surface of the free ferromagnetic lamination layer, and the first wiring line and the second wiring line are formed of a same conductive material. Also, it is desirable that the oxide region is formed of oxide of the conductive material, and a structure of the first wiring line, the second wiring line and the oxide region covers a whole surface of the free ferromagnetic lamination layer.

Also, a direction in which the write current flows may be diagonal to the direction of each of the first magnetization of the first ferromagnetic layer and the second magnetization of the second ferromagnetic layer, viewing from a direction perpendicular to the surface of the free ferromagnetic lamination layer. In this case, it is desirable that the direction in which the write current flows is substantially perpendicular to a direction of the magnetic field which makes coercive force of each of the first ferromagnetic layer and the second ferromagnetic layer the smallest, viewing from the perpendicular direction.

Also, it is desirable that the first ferromagnetic layer and the second ferromagnetic layer are formed to meet the following equation:

$$M_1 * V_1 = M_2 * V_2$$

where $M_1$ and $M_2$ are magnitudes of magnetization of the first ferromagnetic layer and the second ferromagnetic layer, respectively and $V_1$ and $V_2$ are volumes of the first ferromagnetic layer and the second ferromagnetic layer, respectively. In this case, it is desirable that planar shapes of the first ferromagnetic layer and the second ferromagnetic layer are substantially same, M1 and M2 are substantially equal, and thicknesses of the first ferromagnetic layer and the second ferromagnetic layer are substantially same.

Also, it is desirable that the first ferromagnetic layer and the second ferromagnetic layer are formed of same material, planar shapes of the first ferromagnetic layer and the second ferromagnetic layer are same, the planar shapes of the first ferromagnetic layer and the second ferromagnetic layer have an anisotropy, and the first ferromagnetic layer and the second ferromagnetic layer are different from each other in thickness.

In another aspect of the present invention, a magnetic random access memory includes a plurality of memory cell, and each of the plurality of memory cells includes a MTJ (magnetic tunnel junction) device, a MISFET (metal insulator semiconductor field effect transistor), a first wiring line, and a second wiring line. The MTJ device includes a pinned ferromagnetic layer which has a fixed pinned magnetization, a free ferromagnetic lamination layer, and a tunnel barrier layer interposed between the pinned ferromagnetic layer and the free ferromagnetic lamination layer. The free ferromagnetic lamination layer includes a first ferromagnetic layer coupled to the tunnel barrier layer and having a first magnetization which is reversible, a second ferromagnetic layer which has a second magnetization whose direction is opposite to a direction of the first magnetization, the direction of the second magnetization being reversible, and a non-magnetic conductive layer put between the first ferromagnetic layer and the second ferromagnetic layer and having a sheet resistance lower than that of each of the first ferromagnetic layer and the second ferromagnetic layer. The first wiring line and the second wiring line are coupled to the free ferromagnetic lamination layer, and the MISFET is connected with the free ferromagnetic lamination layer through the second wiring line. One of the first wiring line and the second wiring line supplies a write current to the free ferromagnetic lamination layer to reverse the first magnetization and the second magnetization, and the other of the first wiring line and the second wiring line receives the write current from the free ferromagnetic lamination layer.

Here, a film thickness of the non-magnetic conductive layer is thin, and a film thickness of at least one of the first wiring line and the second wiring line is thick.

Also, it is desirable that a direction in which the write current flows is diagonal to a direction of the first magnetization of the first ferromagnetic layer and a direction of the second magnetization of the second ferromagnetic layer, viewing from a direction perpendicular to a surface of the free ferromagnetic lamination layer. Also, a direction in which the write current flows may be substantially perpendicular to a direction of a magnetic field which makes coercive force of each of the first ferromagnetic layer and the second ferromagnetic layer the smallest, viewing from the perpendicular direction.

Also, another aspect of the present invention, a magnetic random access memory includes a pinned ferromagnetic layer having a pinned magnetization, a free ferromagnetic lamination layer, a tunnel barrier layer interposed between the pinned ferromagnetic layer and the free ferromagnetic lamination layer, and a current supply section. The free ferromagnetic lamination layer includes a first ferromagnetic layer coupled to the tunnel barrier layer and having a first magnetization which is reversible, a second ferromagnetic layer having a second magnetization whose direction is opposite to the direction of the first magnetization, the direction of the second magnetization being reversible, and a non-magnetic conductive layer put between the first ferromagnetic layer and the second ferromagnetic layer. The current supply section supplies a current to the free ferromagnetic lamination layer to reverse directions of the first magnetization and the second magnetization, and the current passes through the second ferromagnetic layer to flow into the non-magnetic conductive layer, flows through the non-magnetic conductive layer in a direction which has a direction component parallel to the surface of the non-magnetic conductive layer, and flows out from the free ferromagnetic lamination layer through the non-magnetic conductive layer and the second ferromagnetic layer.

Also, another aspect of the present invention, a method of manufacturing of a magnetic random access memory, includes forming a MTJ device, forming a conductive layer on a surface of the MTJ device, and selectively oxidizing a part of the conductive layer which is located on the MTJ device, to form a first wiring line, a second wiring line and an oxide region interposed between the first wiring line which is not oxidized, and the second wiring line which is not oxidized. The MTJ device includes a pinned ferromagnetic layer having a fixed pinned magnetization, a free ferromagnetic lamination layer, and a tunnel barrier layer interposed between the pinned ferromagnetic layer and the free ferromagnetic lamination layer. The free ferromagnetic lamination layer includes a first ferromagnetic layer coupled to the tunnel barrier layer and having a first magnetization which is reversible, a second ferromagnetic layer having a second magnetization whose direction is opposite to a direction of the first magnetization, the direction of the second magnetization being reversible, and a non-magnetic conductive layer put between the first ferromagnetic layer and the second ferromagnetic layer and having a sheet resistance lower than that of each of the first ferromagnetic layer and the second ferromagnetic layer. The film thickness of at least one of the first wiring line and the second wiring line is ticker than a film thickness of the non-magnetic conductive layer.

BEST FORM FOR CARRYING OUT THE INVENTION

Hereinafter, an MRAM (magnetic random access memory) of the present invention will be described in detail with reference to the attached drawings.

[First Embodiment]

Figure 1:
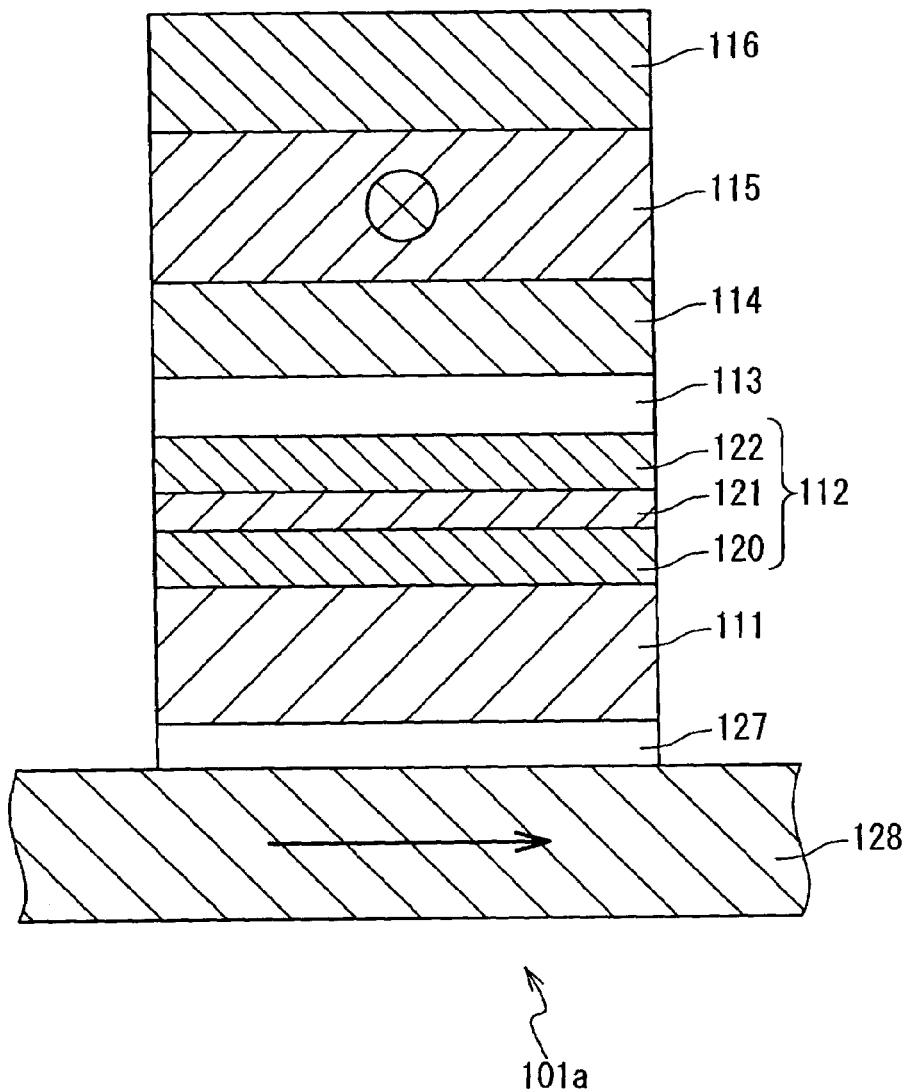
FIG. 1 is a cross sectional view showing a conventional MRAM.
Figure 2:
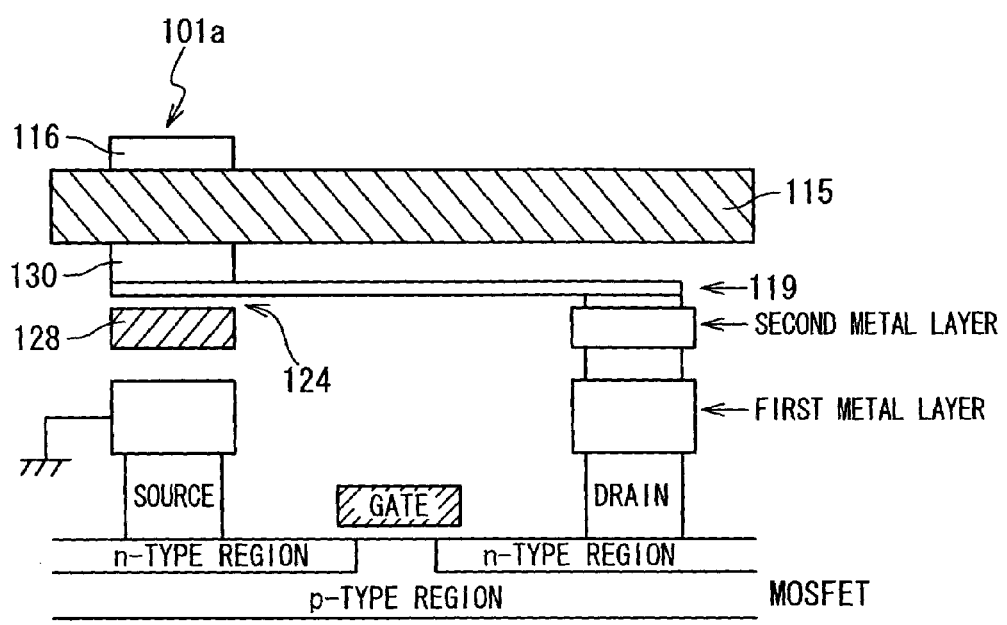
FIG. 2 is a cross sectional view showing another conventional MRAM.
Figure 3:
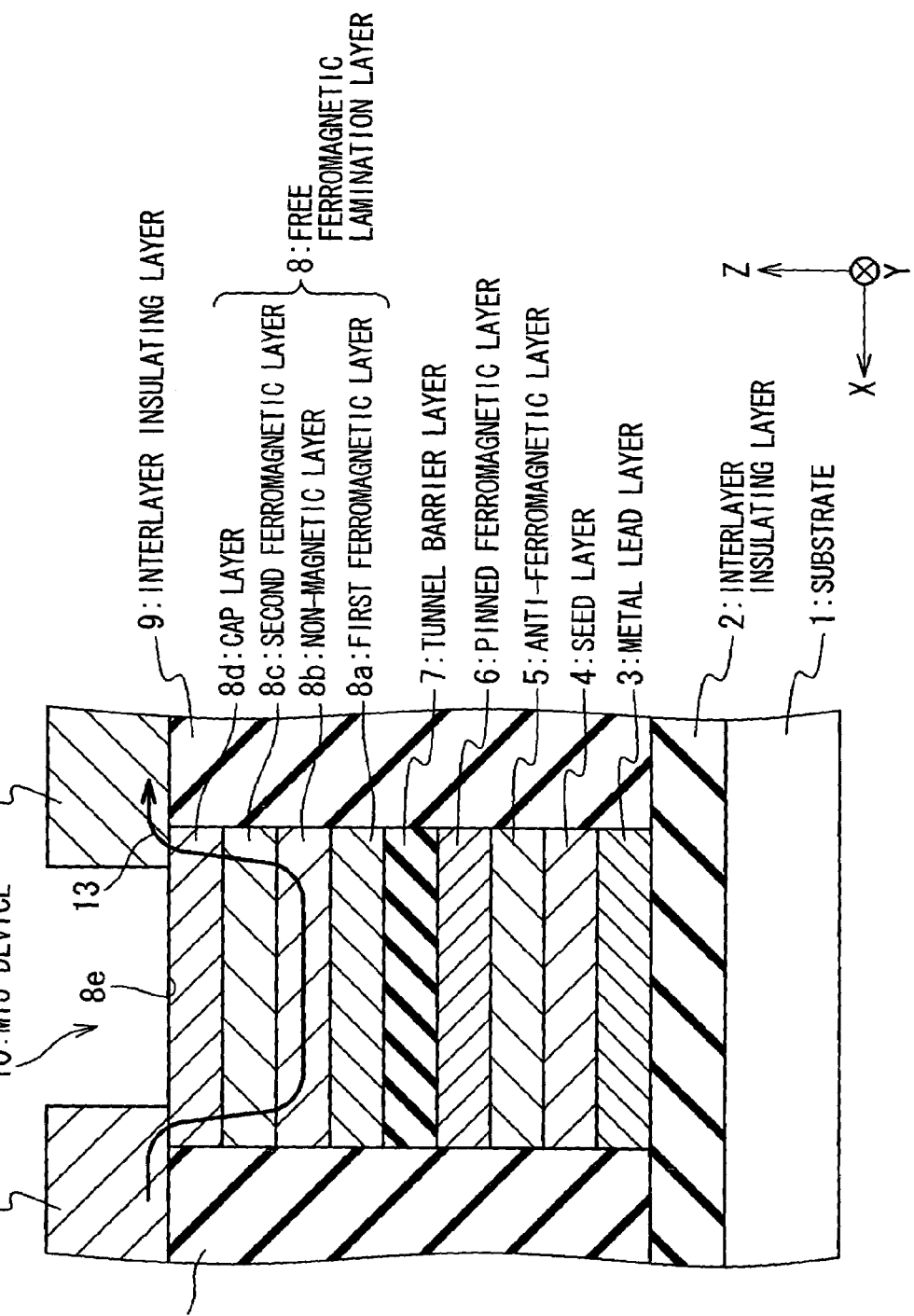
FIG. 3 is a cross sectional view showing the structure of a MRAM according to a first embodiment of the present invention.

As shown in FIG. 3, in the MRAM according to the first embodiment of the present invention, a substrate 1 on which transistors (not shown) are formed is covered with an interlayer insulating layer 2. A metal lead layer 3 is formed on the interlayer insulating layer 2 and is formed from a film of metal such as Al and Cu. The metal lead layer 3 is grounded.

An MTJ device 10 is formed on the metal lead layer 3. The MTJ device 10 functions as a data-hold body of a memory cell of the MRAM. The side surfaces of the MTJ device 10 are covered and protected by an interlayer insulating layer 9. The MTJ device 10 contains a seed layer 4, an anti-ferromagnetic layer 5, a pinned ferromagnetic layer 6, a tunnel barrier layer 7, and a free ferromagnetic lamination layer 8 formed in this order. The seed layer 4 is formed directly on the metal lead layer 3 to improve the crystallinity of the anti-ferromagnetic layer 5 which is formed on the layer 4. A Ta film or a lamination film of the Ta film and a Ru film is used as the seed layer 4. The anti-ferromagnetic layer 5 is formed of anti-ferromagnetic material such as FeMn, IrMn and PtMn. The pinned ferromagnetic layer 6 is formed of ferromagnetic material such as CoFe which is relatively hard in magnetic property. The direction of magnetization of the pinned ferromagnetic layer 6 is fixed or pinned by exchange interaction with the anti-ferromagnetic layer 5. The tunnel barrier layer 7 is formed from a non-magnetic insulator such as an aluminum oxide film. The tunnel barrier layer 7 is thin to the extent that tunnel current flows into a direction of the film thickness, i.e., into a direction perpendicular to the surface of the tunnel barrier layer 7, and typically has the thickness of 1.2 to 2.0 nm.

The free ferromagnetic lamination layer 8 contains a first ferromagnetic layer 8a, a non-magnetic layer 8b, a second ferromagnetic layer 8c and a cap layer 8d. The first ferromagnetic layer 8a and the second ferromagnetic layer 8c are of magnetically soft ferromagnetic substance and are formed of material such as NiFe and NiFeCo. The direction of magnetization of the first ferromagnetic layer 8a and the direction of magnetization of the second ferromagnetic layer 8c are opposite to each other. The first ferromagnetic layer 8a and the second ferromagnetic layer 8c are magnetized into a direction determined in accordance with data to be stored in the MTJ device 10. The first ferromagnetic layer 8a is formed on the tunnel barrier layer 7, and the first ferromagnetic layer 8a, the tunnel barrier layer 7 and the pinned ferromagnetic layer 6 constitute a magnetic tunnel junction (MTJ). The resistance of the MTJ changes in accordance with the relative directions of magnetizations of the first ferromagnetic layer 8a and pinned ferromagnetic layer 6. The data stored in the MTJ device 10 is determined based on the change of the resistance of the MTJ.

The non-magnetic layer 8b is interposed between the first ferromagnetic layer 8a and the second ferromagnetic layer 8c. The thickness of the non-magnetic layer 8b is thin to the extent that the first ferromagnetic layer 8a and the second ferromagnetic layer 8c combine magnetostatically with each other. From the viewpoint of the stabilization of the magnetizations of the first ferromagnetic layer 8a and the second ferromagnetic layer 8c, it is preferable that the non-magnetic layer 8b is formed to be very thin to the extent that the first ferromagnetic layer 8a and the second ferromagnetic layer 8c are combined through exchange interaction. However, it is not always necessary that the non-magnetic layer 8b is very thin. The non-magnetic conductive layer 8b is formed of a conductor with a large conductivity such as Cu, Pt, Ag, Au and Ru. The sheet resistance of the non-magnetic layer 8b is sufficiently smaller than the sheet resistance of the first ferromagnetic layer 8a, the second ferromagnetic layer 8c and the cap layer 8d. The sheet resistance of the non-magnetic layer 8b is preferably equal to or less than 1/10 of the sheet resistance of the first ferromagnetic layer 8a, the second ferromagnetic layer 8c or the cap layer 8d.

The cap layer 8d is provided to protect the layers such as the seed layer 4, the anti-ferromagnetic layer 5, the pinned ferromagnetic layer 6, the tunnel barrier layer 7, the first ferromagnetic layer 8a, the non-magnetic layer 8b and the second ferromagnetic layer 8c from a damage during the manufacturing processes. The cap layer 8d is typically formed of Ta.

Figure 4:
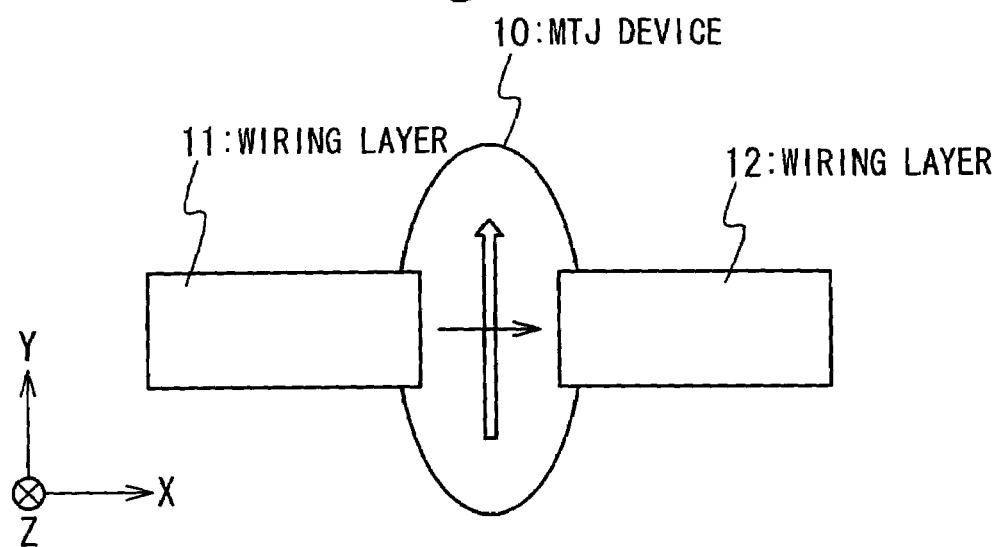
FIG. 4 is a plan view showing the MRAM according to the first embodiment of the present invention.

As shown in FIG. 4, the MTJ device 10 is formed to be long into the Y direction and has a magnetic anisotropy caused based on the shape in the Y direction. Thus, a magnetization easy axis in the pinned ferromagnetic layer 6, the first ferromagnetic layer 8a and the second ferromagnetic layer 8c is turned to the Y direction. The magnetizations of the pinned ferromagnetic layer 6, the first ferromagnetic layer 8a and the second ferromagnetic layer 8c are parallel to the Y direction. A wiring layer 11 and a wiring layer 12 are provided on the surface 8e of the cap layer 8d. The thicknesses of the wiring layer 11 and wiring layer 12 are very much thicker than the non-magnetic layer 8b. As shown in FIG. 4, the wiring layer 11 and the wiring layer 12 are aligned in the X direction.

A read operation of data from the MTJ device 10 is carried out through the following process. That is, a voltage is applied to one of the wiring layer 11 and the wiring layer 12 and the other is set to a high impedance state. Because the metal lead layer 3 is grounded, a read current flows through the tunnel barrier layer 7 in the MTJ device 10. A value of the read current corresponds to the resistance of the MTJ device 10, i.e., the data stored in the MTJ device 10. The data stored in the MTJ device 10 can be determined based on the read current value.

On the other hand, a write operation of data into the MTJ device 10, i.e., the reversal of the directions of the magnetizations of the first ferromagnetic layer 8a and the second ferromagnetic layer 8c is carried out by applying a voltage between the wiring layer 11 and the wiring layer 12. As shown in FIG. 3, when a potential of the wiring layer 11 is higher than a potential of the wiring layer 12, the write current flows from the wiring layer 11 to the wiring layer 12. The write current flows into the surface 8e of the cap layer 8d of the free ferromagnetic lamination layer 8. As mentioned above, because the sheet resistance of the non-magnetic layer 8b is sufficiently smaller than the sheet resistances of the first ferromagnetic layer 8a, the second ferromagnetic layer 8c and the cap layer 8d, a main part of the write current flows through the cap layer 8d and the second ferromagnetic layer 8c into the non-magnetic layer 8b. The main part of the write current passes through the cap layer 8d and the second ferromagnetic layer 8c into a direction perpendicular to the surface of the cap layer 8d and the second ferromagnetic layer 8c. The main part of the write current flows through the non-magnetic layer 8b in a direction parallel to the plane of the non-magnetic layer 8b and then through the second ferromagnetic layer 8c and the cap layer 8d again 8b into the wiring layer 12. The main part of the write current passes through the cap layer 8d and the second ferromagnetic layer 8c into a direction perpendicular to the surfaces of the cap layer 8d and the second ferromagnetic layer 8c again. A path of the main part of the write current is shown by the arrow 13 in FIG. 3. The path of the write current is almost directed to the X direction, viewing from the direction perpendicular to the surface of the substrate 1.

When the write current flows through the non-magnetic layer 8b, a magnetic field generated by the write current is applied to the first ferromagnetic layer 8a and the second ferromagnetic layer 8c which are located on and under the non-magnetic layer 8b. The directions of magnetizations of the first ferromagnetic layer 8a and the second ferromagnetic layer 8c are reversed by this magnetic field. Because the magnetic field applied to the first ferromagnetic layer 8a and the second ferromagnetic layer 8c is opposite in direction when the current flows through the non-magnetic layer 8b, the directions of magnetizations of the first ferromagnetic layer 8a and second ferromagnetic layer 8c are always kept at the opposite directions.

The main part of the write current flows through the cap layer 8d and the second ferromagnetic layer 8c in the direction to penetrate them. However, the magnetic field generated based on the write current does not obstruct the reversal of the magnetization of the second ferromagnetic layer 8c. The direction of the magnetic field is the same as the direction of the magnetic field generated in the non-magnetic layer 8b, and rather promotes the reversal of the direction of the magnetization of the second ferromagnetic layer 8c. This is preferable in the point that the write current can be reduced.

The structure shown in FIG. 3 makes it possible to carry out the write operation of data into the MTJ device 10 in a little current. The first ferromagnetic layer 8a and the second ferromagnetic layer 8c are in contact with the non-magnetic layer 8b, and the distance between each of the first ferromagnetic layer 8a and the second ferromagnetic layer 8c and the center of the write current is very short. For this reason, the large magnetic field is applied to the first ferromagnetic layer 8a and the second ferromagnetic layer 8c. Therefore, the directions of the magnetizations of the first ferromagnetic layer 8a and second ferromagnetic layer 8c can be reversed in a little current, i.e., the write operation of data into the MTJ device 10 can be carried out in the a little current.

Moreover, in the structure of FIG. 3, it is possible to restrain the resistance of the path through which the write current flows while the stability of the magnetizations of the first ferromagnetic layer 8a and second ferromagnetic layer 8c are improved. In the structure of FIG. 3, the film thicknesses of the non-magnetic layer 8b, the writing layer 11 and the wiring layer 12 can be designed to be independent from each other. Therefore, the non-magnetic layer 8b is formed to be thin to shorten the distance between the first ferromagnetic layer 8a and the second ferromagnetic layer 8c, and the wiring layer 11 and the wiring layer 12 are formed thicker than the non-magnetic layer 8b. Since the non-magnetic layer 8b is formed to be thin, magnetostatic coupling between the first ferromagnetic layer 8a and the second ferromagnetic layer 8c is enhanced. Thus, it can be prevented that the directions of magnetizations of the first ferromagnetic layer 8a and second ferromagnetic layer 8c are reversed by external disturbance when the write operation is not carried out. Because the non-magnetic layer 8b is thin, a density of the write current flowing through the non-magnetic layer 8b increases. The structure shown in FIG. 3 is preferable in the point that a strong magnetic field can be generated by the same current. On the other hand, when the wiring layer 11 and the wiring layer 12 are made thicker, the resistances of the wiring layer 11 and the wiring layer 12 can be made small. Thus, it is possible to decrease the resistance of the path through which the write current flows. In order to further stabilize the magnetizations of the first ferromagnetic layer 8a and the second ferromagnetic layer 8c, the non-magnetic layer 8b is desirably formed of material in a thickness in such a manner that anti-ferromagnetic exchange interaction is generated between the first ferromagnetic layer 8a and the second ferromagnetic layer 8c.

As described above, in the MRAM of this embodiment, the write operation of data into the MTJ device 10 in a little current is possible. Moreover, in the MRAM of this embodiment, the resistance of the path through which the write current flows can be restrained while the stability of the magnetizations of the first ferromagnetic layer 8a and second ferromagnetic layer 8c is improved.

(First Modification)

In the MRAM of the 1-axis write structure, at least one MOS transistor is provided to supply the write current to each of the memory cells (the MTJ devices 10) and the write current is supplied only to the memory cell for the data to be written. The MRAM of this embodiment is especially preferable when the 1-axis write structure is adopted. The phrase "write current is supplied only to a specific memory cell" means that two write currents different in direction are not supplied to select a memory cell for the data to be written, unlike the conventional memory cell array. In the 1-axis write structure, because a magnetic field is applied only to the memory cell to which the write operation is carried out, the selectivity is very high. Moreover, because the large magnetic field can be applied to the memory cell in the 1-axis write structure, the certainty of the data write is high. However, because many MOS transistors must be incorporated into the memory cell array in the 1-axis write structure, the gate width of the MOS transistor is limited. For this limitation of the write current, it is difficult to supply the large write current to the memory cell. Therefore, the 1-axis write structure strongly requires the decrease of the write current. The MTJ device 10 shown in FIG. 3 can decrease the write current and it is especially preferable in the MRAM which adopts the 1-axis write structure.

Figure 5:
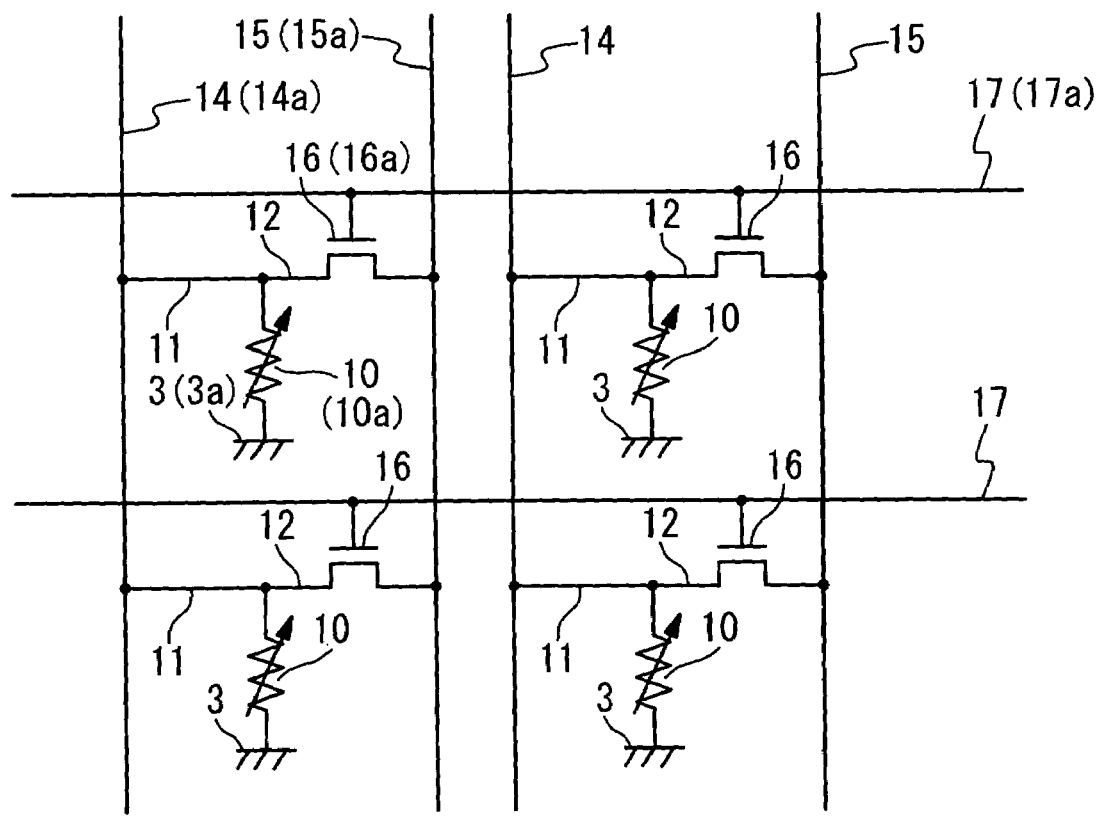
FIG. 5 is a circuit diagram showing a first modification of the MRAM according to the first embodiment of the present invention.

FIG. 5 shows an example of the MRAM which adopts the 1-axis write structure. The MOS transistor 16 is provided for each of the MTJ devices 10. The wiring layer 11 is connected with a first bit line 14 and the wiring layer 12 is connected with a second bit line 15 through the MOS transistor 16. A word line 17 is connected with the gate of the MOS transistor 15 to turn on and off the MOS transistor 15.

The write operation in the MRAM shown in FIG. 5 is carried out through the following processes. First, one of the memory cells arranged in a matrix is selected. It is supposed that the memory cell which contains a MTJ device 10a in FIG. 5 is selected. The word line 17 which is connected with a MOS transistor 16a which is connected with the MTJ device 10a is set to a high potential so that the MOS transistor 16a is turned on. Moreover, a potential V1 is supplied to a first bit line 14a of the first bit lines 14 which is connected with the MTJ device 10a and a potential V2 (≠V1) is supplied to a second bit line 15a of second bit lines 15 which is connected with the MTJ device 10a. The other first bit lines 14, second bit lines 15 and word lines 17 are set to a low potential. Thus, the write current flows through the wiring layer 11 and the wiring layer 12 which are connected with the MTJ device 10a and the magnetization of the first ferromagnetic layer 8a and the second ferromagnetic layer 8c in the MTJ device 10a are reversed to a desired direction.

On the other hand, the read operation in the MRAM shown in FIG. 5 is carried out in the following processes. First, one of the memory cells (the MTJ devices 10) is selected. It is supposed that the MTJ device 10a of FIG. 5 is selected. The word line 17 which is connected with the MOS transistor 16a which is connected with the MTJ device 10a is set to the high potential and the MOS transistor 16a is turned on. Moreover, a potential Vb is supplied to the second bit line 15a of the second bit lines 15 which is connected with the MTJ device 10a. All the first bit lines 14 are set to a high impedance state. As described above, because the metal lead layer 3 is grounded, the read current flows from the second bit line 15a to a metal lead layer 3a which is connected with the MTJ device 10a through the MTJ device 10a. The data stored in the MTJ device 10a can be determined based on a value of the read current.

(Second Modification)

Figure 6:
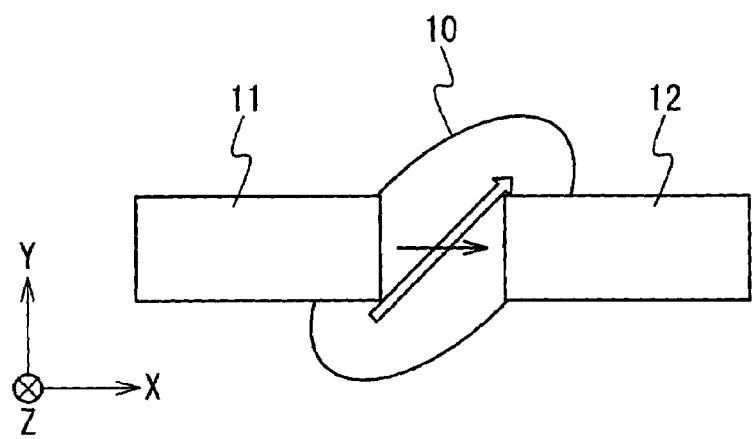
FIG. 6 is a plan view showing a second modification of the MRAM according to the first embodiment of the present invention.

In the second modification, the direction into which the write current flows is diagonal to the directions of the easy axes of the first ferromagnetic layer 8a and the second ferromagnetic layer 8c, as shown in FIG. 6, in a plan view. This is effectively in the reduction of the write current.

Figure 7:
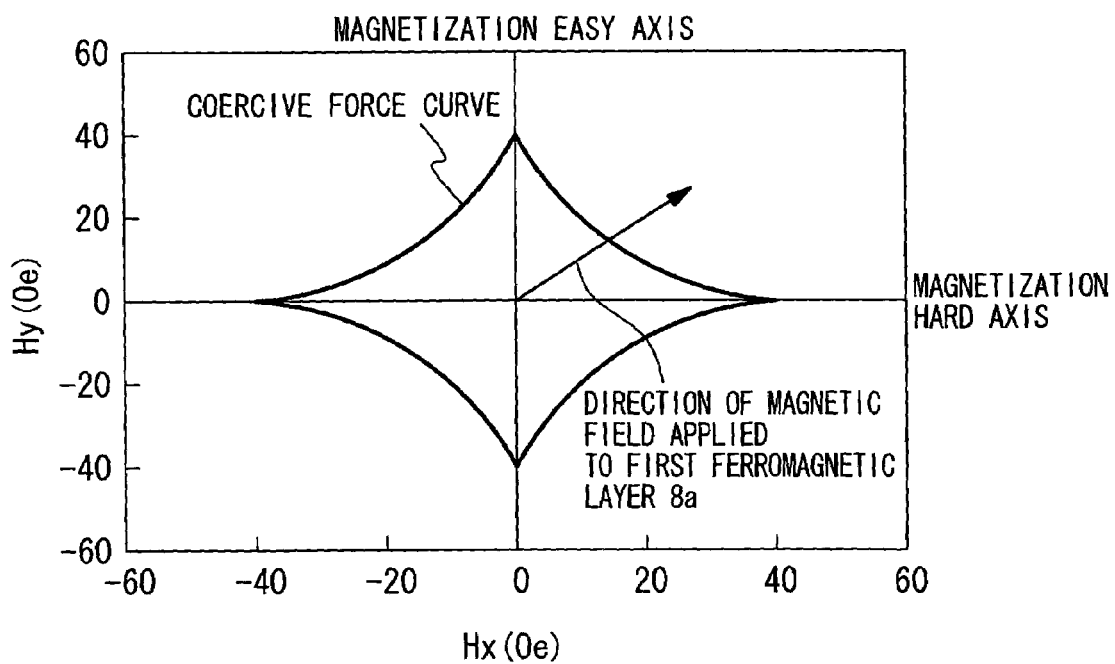
FIG. 7 is a diagram showing a direction of a magnetic field applied to a first ferromagnetic layer in the second modification of the MRAM according to the first embodiment.

As shown in FIG. 7, if the direction into which the write current is flows is diagonal or oblique to the direction of the easy axis in the first ferromagnetic layer 8a and the second ferromagnetic layer 8c, a magnetic field is applied in the diagonal direction to the easy axis in the first ferromagnetic layer 8a and the second ferromagnetic layer 8c. As widely known to the person in the art, it is possible to reverse the directions of the magnetizations of the first ferromagnetic layer 8a and the second ferromagnetic layer 8c in a weaker magnetic field by applying the magnetic field in the diagonal direction to the easy axis, depending on the asteroid characteristic of the ferromagnetic material. Therefore, if the direction into which the write current flows is diagonal to the direction of the easy axis in the first ferromagnetic layer 8a and the second ferromagnetic layer 8c, the write current can be made small.

When the above-mentioned 1-axis write structure is adopted, it is preferable that the direction in which the write current flows is substantially coincident with the direction perpendicular to a direction in which coercive forces of the first ferromagnetic layer 8a and second ferromagnetic layer 8c are minimum in the plane of the first ferromagnetic layer 8a and the second ferromagnetic layer 8c. Thus, the direction of the magnetic field generated by the write current is coincident with the direction in which the coercive force in the first ferromagnetic layer 8a and the second ferromagnetic layer 8c are the smallest in the plane of the first ferromagnetic layer 8a and the second ferromagnetic layer 8c. Therefore, the data can be written in the smaller write current.

The adoption of the 1-axis write structure point is preferable in the point that the direction of the magnetic field generated by the write current can be easily made coincident with the direction in which the coercive forces in the first ferromagnetic layer 8a and the second ferromagnetic layer 8c are minimum. Generally, the write operation of data into the MTJ device is carried out by respectively applying the write current to two orthogonal wiring lines to generate a synthetic magnetic field in the direction diagonal to the direction of the easy axis in the free ferromagnetic layer. However, in this conventional method, to adjust the direction, in which the coercive force of the free ferromagnetic layer is minimum, to the direction of the synthetic magnetic field, the distance between the free ferromagnetic layer and the wiring line and the magnitude of the write current must be optimized. This imposes important restriction on the magnitude of the write current. On the other hand, in the 1-axis write structure of this embodiment, by arranging the wiring layer 11 and the wiring layer 12 on appropriate positions, the direction of the magnetic field generated by the write current can be adjusted to the direction in which the coercive forces in the first ferromagnetic layer 8a and the second ferromagnetic layer 8c are minimum. Thus, an optimization in the magnitude of the write current is not required.

(Third Modification)

Moreover, in the MRAM of the third modification, the first ferromagnetic layer 8a and the second ferromagnetic layer 8c are desirably designed to meet the following equation (1):

$$M_1 * V_1 = M_2 * V_2 \quad (1)$$

where $M_1$ and $M_2$ are the magnetizations of the first ferromagnetic layer 8a and the second ferromagnetic layer 8c, respectively, and $V_1$ and $V_2$ are the volumes of the first ferromagnetic layer 8a and the second ferromagnetic layer 8c, respectively. When the first ferromagnetic layer 8a and the second ferromagnetic layer 8c have the same shape in a plan view, i.e., viewing from the direction perpendicular to the upper surface (and lower surface), the equation (1) can be rewritten as follows:

$$M_1 * t_1 = M_2 * t_2 \quad (1)'$$

where $t_1$ and $t_2$ are the film thicknesses of the first ferromagnetic layer 8a and the second ferromagnetic layer 8c, respectively. The conditions of the equation (1) can be achieved easily by forming the first ferromagnetic layer 8a and the second ferromagnetic layer 8c of the same material to have the same plane shape and the same film thickness (i.e., by setting $t_1 = t_2$).

When the equation (1) is satisfied, it is possible to restrain the reversal of the directions of the magnetizations of the first ferromagnetic layer 8a and the second ferromagnetic layer 8c by thermal disturbance without being accompanied by the increase of the coercive forces in the first ferromagnetic layer 8a and the second ferromagnetic layer 8c. The reason why such an effect is achieved is as follows.

In the MRAM of this example, the directions of the magnetizations of the first ferromagnetic layer 8a and the second ferromagnetic layer 8c are determined to minimize the energy E shown by the following equation (2):

$$E = (1/2)(H_{kI1} M_1 V_1 + H_{kI2} M_2 V_2) \sin_2 \phi + \quad (2)$$
$$(1/2)(H_{kS1} - H_{kS2})(M_1 V_1 - M_2 V_2) \sin_2 \phi -$$
$$H_{ext}(M_1 V_1 - M_2 V_2) \cos(\theta_{ext} - \phi) -$$
$$H_i (M_1 V_1 + M_2 V_2) \cos(\theta_i - \phi)$$

where $H_{kI1}$ and $H_{kI2}$ are anisotropic magnetic fields depending on the crystal magnetic anisotropy in the first ferromagnetic layer 8a and the second ferromagnetic layer 8c, respectively, $H_{kS1}$ and $H_{kS2}$ are anisotropic magnetic fields depending on the shape magnetic anisotropy in the first ferromagnetic layer 8a and the second ferromagnetic layer 8c, respectively, $\phi$ is an angle between an easy axis in the first ferromagnetic layer 8a and the direction of the magnetization of the first ferromagnetic layer 8a, $\theta_{ext}$ is an angle between the easy axis and the external magnetic field $H_{ext}$ (that is, a magnetic field other than the magnetic field generated by the current flowing through the non-magnetic conductive layer 8b), and $\theta_i$ is an angle between the easy axis and the magnetic field $H_i$ generated by the current flowing through the non-magnetic conductive layer 8b. In the deviation of the equation (2), it is supposed that the directions of magnetizations of the first ferromagnetic layer 8a and the second ferromagnetic layer 8c are reversed while they combine anti-ferromagnetically with each other. That is, it is supposed that the angle between a magnetization easy axis of the first ferromagnetic layer 8a and a magnetization direction of the first ferromagnetic layer 8a is $\phi_1$, and the angle between a magnetization easy axis of the second ferromagnetic layer 8c and a magnetization direction of the second ferromagnetic layer 8c is $\phi_2$. At this time, it is presumed that $\phi=\phi_1=\phi_2+\pi$ is satisfied.

The second term of the equation (2) is 0 from the equation (1). That is, the directions of the magnetizations of the first ferromagnetic layer 8a and the second ferromagnetic layer 8c do not depend on the anisotropic magnetic fields $H_{kS1}$ and $H_{kIS}$ by the shape magnetic anisotropy in the first ferromagnetic layer 8a and the second ferromagnetic layer 8c. Therefore, the coercive force in the first ferromagnetic layer 8a or the second ferromagnetic layer 8c depends on the crystal magnetic anisotropy in the first ferromagnetic layer 8a and the second ferromagnetic layer 8c but does not depend on the shape of the first ferromagnetic layer 8a and the second ferromagnetic layer 8c. This means that the coercive force is determined based on only material of the first ferromagnetic layer 8a or the second ferromagnetic layer 8c, and even if the volume $V_1$ of the first ferromagnetic layer 8a and the volume $V_2$ of the second ferromagnetic layer 8c are made large, the coercive force (that is, the magnitude of the magnetic field necessary to reverse the first ferromagnetic layer 8a and the second ferromagnetic layer 8c) does not become large.

Moreover, when the write current does not flow through the non-magnetic conductive layer 8b (that is, when the write operation is not carried out), the equation (2) is transformed by using the equation (1)' as follows.

$$E=(1/2)(H_{kI1}M_1V_1+H_{kI2}M_2V_2)\sin_2\phi \qquad (2)'$$

This means that the energy barrier against the reversal of the directions of magnetizations of the first ferromagnetic layer 8a and the second ferromagnetic layer 8c becomes high by increasing the volumes $V_1$ and $V_2$ of the first ferromagnetic layer 8a and second ferromagnetic layer 8c, so that data damage due to thermal disturbance is difficult to happen.

Therefore, if the first ferromagnetic layer 8a and the second ferromagnetic layer 8c are formed to satisfy the above equation (1) and the volumes of the first ferromagnetic layer 8a and second ferromagnetic layer 8c are enough large, it is possible to prevent the reversal of the directions of magnetizations of the first ferromagnetic layer 8a and second ferromagnetic layer 8c due to the thermal disturbance without being accompanied by the increase of the coercive forces of the first ferromagnetic layer 8a and second ferromagnetic layer 8c.

It is preferable in the point that the first ferromagnetic layer 8a and the second ferromagnetic layer 8c can have planar isotropic shapes such as square and circle that the first ferromagnetic layer 8a and the second ferromagnetic layer 8c are formed to meet the above equation (1). At this time, it is preferable that the MTJ devices 10 can be densely arranged.

Moreover, it is preferable in the point that it is possible to prevent deviation of the coercive force in the first ferromagnetic layer 8a and the first ferromagnetic layer 8a due to deviation in the planar shape of the second ferromagnetic layer 8c and the second ferromagnetic layer 8c that the first ferromagnetic layer 8a and the second ferromagnetic layer 8c are formed to meet the above equation (1). As mentioned previously, when the first ferromagnetic layer 8a and the second ferromagnetic layer 8c are formed to meet the above equation (1), the coercive force in the first ferromagnetic layer 8a and the second ferromagnetic layer 8c does not depend on the shapes of the first ferromagnetic layer 8a and the second ferromagnetic layer 8c. Therefore, the deviation of the coercive forces of the first ferronagnetic layer 8a and second ferromagnetic layer 8c is not caused due to the deviation of the planar shapes of the first ferromagnetic layer 8a and second ferromagnetic layer 8c.

It is preferable in the point that it is possible to decrease a leakage magnetic field from one memory cell to a neighbor memory cell to substantially zero that the first ferromagnetic layer 8a and the second ferromagnetic layer 8c are formed to meet the above equation (1). When the first ferromagnetic layer 8a and the second ferromagnetic layer 8c are formed to meet the above equation (1), a magnetic path of the magnetic field generated by the first ferromagnetic layer 8a and the second ferromagnetic layer 8c becomes a closed path. Therefore, the leak magnetic field becomes substantially zero. This is preferable in the point that the magnetostatic influence to the neighbor memory cell can be substantially eliminated.

it should be note that the third term of the equation (2) (i.e., the term that depends on the external magnetic field $H_{ext}$) becomes 0 when the first ferromagnetic layer 8a and the second ferromagnetic layer 8c are formed to meet the above equation (1). This means that the directions of magnetizations of the first ferromagnetic layer 8a and second ferromagnetic layer 8c do not reverse by applying a magnetic field externally, unlike the conventional memory cell. Therefore, the structure satisfying the above equation (1) can be applied to only a case that the directions of magnetizations of the first ferromagnetic layer 8a and the second ferromagnetic layer 8c are reversed by supplying the current to the non-magnetic conductive layer 8b interposed between the above-mentioned first ferromagnetic layer 8a and the second ferromagnetic layer 8c.

An example of the structure of the first ferromagnetic layer 8a and the second ferromagnetic layer 8c will be described. It is supposed that the first ferromagnetic layer 8a and the second ferromagnetic layer 8c are formed of same material to have a same shape. That is, it is supposed that the following equations are satisfied:

$$M_1=M_2(=M)$$

$$H_{kI1}=H_{kI2}(=H_{kI}),$$

and $$V=V_2(=V)$$

Moreover, it is supposed that the first ferromagnetic layer 8a and the second ferromagnetic layer 8c have a disk shape with a diameter w and a thickness t. Moreover, it is supposed that an error correction circuit (ECC) is installed into the MRMA such that an error of 1 bit per 1000 hours is permissible. In this case, the ratio of energy barrier and thermal energy needs to be equal to or more than 50. That is, referring to the equation (2)', the following relation needs to be met:

$$H_{kI}mV/K_BT>50 \qquad (3)$$

where $k_B$ is the Boltzmann constant kB and T is a temperature. Since $$V=(1/4)*\pi*w^2*t,$$

the relation can be expressed from the equation (3) as $$t>4*50*k_BT/(M*H_{kI}*\pi*w^2) \qquad (4)$$

In actual, it is assumed that M=800 (emu/cm$^2$). $H_{kI}$=4 (Oe), T=333 (K), and w=0.3 (μm). Substituting them into the equation (4), T>8 (nm)

That is, if the thickness t of each of the first ferromagnetic layer 8a and the second ferromagnetic layer 8c is thicker than 8 nm, the number of error bits per 1000 hours can be made less than 1. In order to make the directions of magnetizations of the first ferromagnetic layer 8a and the second ferromagnetic layer 8c to turn to the plane direction, it is preferable that the thickness of each of the first ferromagnetic layer 8a and the second ferromagnetic layer 8c is sufficiently smaller than the diameter w.

(Fourth Modification)

In this fourth modification, it is preferable that the first ferromagnetic layer 8a and the second ferromagnetic layer 8c are formed of the same material to have the same planar shape, the planar shape has anisotropy and the thicknesses $t_1$ and $t_2$ of the first ferromagnetic layer 8a and second ferromagnetic layer 8c are different. Thus, it is possible to hold a small coercive force of each of the first ferromagnetic layer 8a and the second ferromagnetic layer 8c while data damage due to thermal disturbance can be restrained by accomplishing a sufficiently large energy barrier. The reason why such an effect is achieved is as follows.

In this modification, the directions of magnetizations of the first ferromagnetic layer 8a and the second ferromagnetic layer 8c are reversed by a magnetic field Hi generated by the write current flowing through the non-magnetic conductive layer 8b, as mentioned above, and the external magnetic field $H_{ext}$ is not used for the reversal of the direction of magnetizations of the first ferromagnetic layer 8a and second ferromagnetic layer 8c. Therefore, the external magnetic field $H_{ext}$ is 0 in case of the write operation. Moreover, from the above-mentioned condition, the following relations are satisfied:

$H_{kI1}=H_{kI2}(=H_{kI})$ $M_1=M_2(=M)$, $t_1 \neq t_2$

It should note that because the thicknesses of the first ferromagnetic layer 8a and second ferromagnetic layer 8c are different even if the planar shapes of them are the same, the following relation is satisfied:

$H_{kS1} \neq H_{kS2}$

From the equation (2) and the above-mentioned conditions, an effective anisotropic magnetic field Hk of each of the first ferromagnetic layer 8a and the second ferromagnetic layer 8c (that is, the minimum of magnetic field $H_i$ necessary to reverse the directions of magnetizations of the first ferromagnetic layer 8a and the second ferromagnetic layer 8c) can be expressed by the following equation (5):

$$H_k=H_{kI}+(H_{kS1}-H_{kS2})*(t_1-t_2)/(t_1+t_2) \quad (5)$$

Moreover, the energy barrier ΔE is expressed by the following equation (6):

$$\Delta E=(1/2)H_k MS(t_1-t_2) \quad (6)$$

The equations (5) and (6) show that design is possible to make the effective anisotropic magnetic field $H_k$ of each of the first ferromagnetic layer 8a and the second ferromagnetic layer 8c small and to increase the energy barrier ΔE through the optimization of the film thickness of each of the first ferromagnetic layer 8a and the second ferromagnetic layer 8c. That is, it is possible to increase the energy barrier ΔE by making the summation $t_1+t_2$ of the film thicknesses of the first ferromagnetic layer 8a and second ferromagnetic layer 8c large. Also, it is possible to decrease the anisotropic magnetic field $H_k$ by decrease the difference $t_1-t_2$ between the film thicknesses of the first ferromagnetic layer 8a and second ferromagnetic layer 8c. It is possible to achieve the increase of the summation $t_1+t_2$ and the decrease of the difference $t_1-t_2$ at the same time. Therefore, through the optimal design of the film thicknesses of the first ferromagnetic layer 8a and second ferromagnetic layer 8c, it is possible to increase the energy barrier ΔE while the effective anisotropic magnetic field $H_k$ of each of the first ferromagnetic layer 8a and the second ferromagnetic layer 8c are made small.

Therefore, it becomes possible to design the MRAM such that the coercive force of each of the first ferromagnetic layer 8a and the second ferromagnetic layer 8c can be kept small while data damage due to thermal fluctuation is restrained by accomplishing a sufficiently large energy barrier, since the first ferromagnetic layer 8a and the second ferromagnetic layer 8c are formed of the same material to have the same planar shape which is anisotropic, and the thicknesses $t_1$ and $t_2$ of them are different.

[Second Embodiment]

Figure 8:
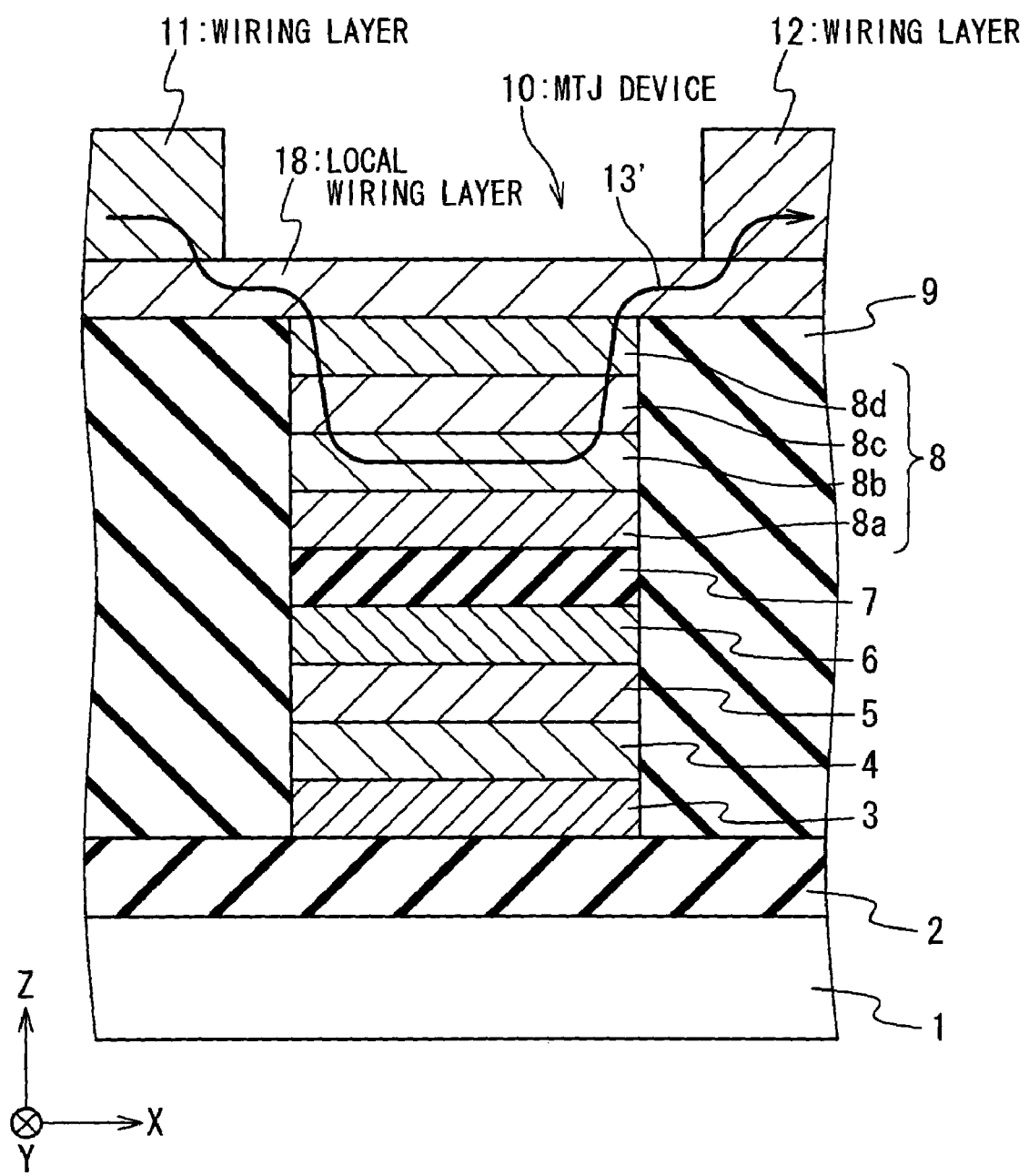
FIG. 8 is a cross sectional view showing the MRAM according to a second embodiment of the present invention.

FIG. 8 shows the MRAM according to the second embodiment of the present invention. In the second embodiment, the MTJ device 10 and the interlayer insulation layer 9 are covered by a local wiring layer 18. The local wiring layer 18 is coupled to the MTJ device 10 in the surface of the cap layer 8d. The wiring layer 11 and the wiring layer 12 are formed on the local wiring layer 18. That is, the local wiring layer 18 is interposed between the surface of the cap layer 8d and the wiring layer 11 and the wiring layer 12.

Figure 9:
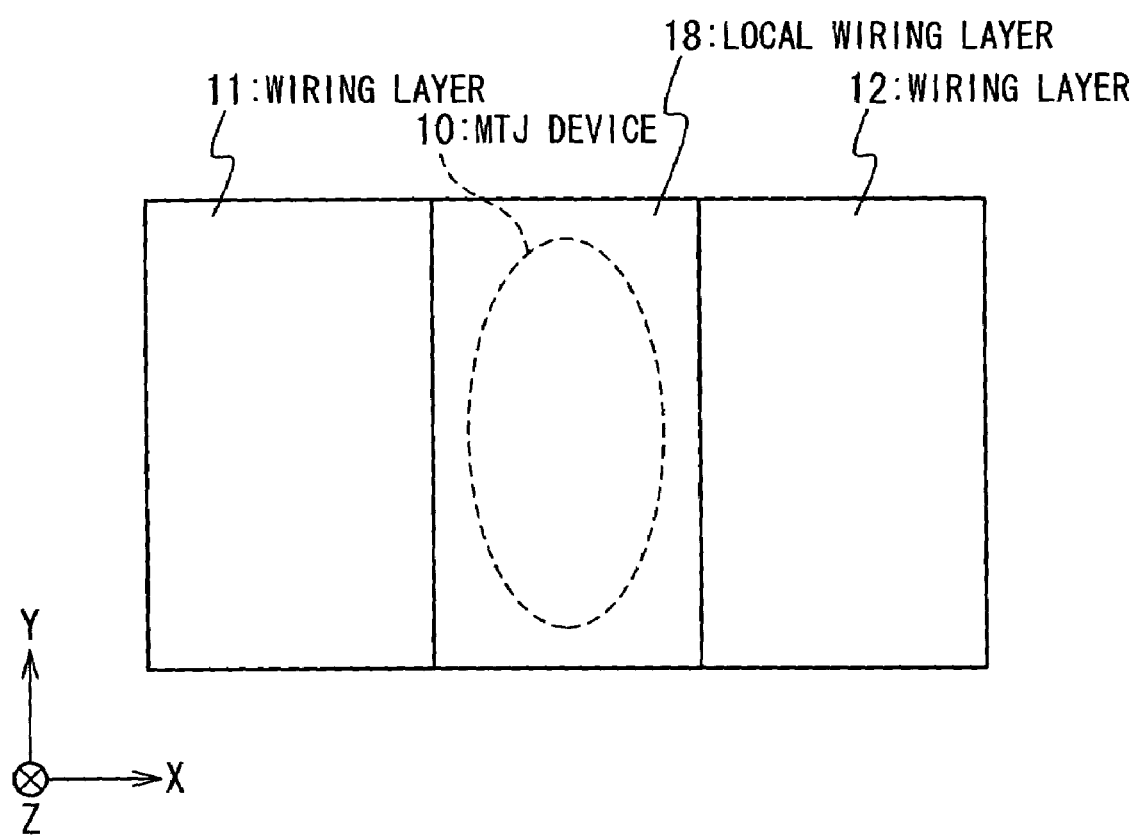
FIG. 9 is a plan view showing the MRAM according to the second embodiment of the present invention.

As shown in FIG. 9, the whole surface of the MTJ device 10 is covered by the local wiring layer 18. The local wiring layer 18 has sufficiently larger sheet resistance than that of the free ferromagnetic lamination layer 8 (i.e., the first ferromagnetic layer 8a, the non-magnetic layer 8b, the second ferromagnetic layer 8c, and the cap layer 8d).

In the second embodiment, the write operation of data into of the MTJ device 10 is carried out by applying a voltage between the wiring layer 11 and the wiring layer 12. As shown in FIG. 8 when the voltage is applied between the wiring layer 11 and the wiring layer 12, the main component of the write current flows through the route shown by the arrow 13'. That is, when the potential higher than that of the wiring layer 12 is applied to the wiring layer 11, the write current flows from the wiring layer 11 into the local wiring layer 18 in the neighborhood of the end of the wiring layer 11. Moreover, because the local wiring layer 18 has the sufficiently larger sheet resistance than that of the free ferromagnetic lamination layer 8, the main component of the write current flows from the local wiring layer 18 into the surface 8e of the cap layer 8d of the free ferromagnetic lamination layer 8. As described above, because the sheet resistance of the non-magnetic layer 8b is sufficiently smaller than the sheet resistance of each of the first ferromagnetic layer 8a, the second ferromagnetic layer 8c and the cap layer 8d, the main part of the write current passes through the cap layer 8d and the second ferromagnetic layer 8c and flows into the non-magnetic layer 8b. The main part of the write current flows in the direction parallel to the plane of the non-magnetic layer 8b, passes through the second ferromagnetic layer 8c and the cap layer 8d to have a component perpendicular to those surfaces and flows into the wiring layer 12. The write current flows almost into direction of the x-axis, viewing from the direction perpendicular to the surface of substrate 1. The directions of the magnetizations of the first ferromagnetic layer 8a and second ferromagnetic layer 8c are reversed to a desired direction by the magnetic field generated by the write current which flows through the non-magnetic layer 8b.

In the MRAM of the second embodiment, the directions of the magnetizations of the first ferromagnetic layer 8a and second ferromagnetic layer 8c are reversed by the magnetic field generated by the write current which flows through the non-magnetic layer 8b which is provided adjacent to the first ferromagnetic layer 8a and the second ferromagnetic layer 8c, like the first embodiment. Therefore, it is possible to write the data into the MTJ device 10 in a little current. Moreover, in the MRAM of this embodiment, because the non-magnetic layer 8b can be made thin and the wiring layers 11 and 12 can be made thick, it is possible to restrain a resistance of the path through which the write current flows while the stability of the directions of magnetizations of the first ferromagnetic layer 8a and second ferromagnetic layer 8c are improved.

Moreover, the structure of the MRAM in the second embodiment is preferable in the point that it is possible to decrease the damage given to the MTJ device 10 during the process of forming the wiring layer 11 and the wiring layer 12. In the first embodiment, it is necessary to carry out plasma etching to a conductive layer after the conductive layer is formed on the cap layer 8d, in order to form the wiring layer 11 and the wiring layer 12. At the time of the plasma etching, the cap layer 8d is directly exposed to the plasma. Thus, it can not be avoided that damage is given to the first ferromagnetic layer 8a and the second ferromagnetic layer 8c in the MTJ device 10 to an extent, because the thickness of the cap layer 8d is limited. In the structure of the MRAM in the second embodiment, it is possible to effectively decrease the damage given to the MTJ device 10, because the MTJ device 10 is covered by the local wiring layer 18 at the time of the etching of the wiring layer 11 and the wiring layer 12.

In the MRAM of the second embodiment, the application of either of the first to fourth modifications is effective. First, it is preferable in the point of reduction of the write current that the direction of the write current is diagonal with respect to the direction of the easy axis of each of the first ferromagnetic layer 8a and the second ferromagnetic layer 8c, viewing from the direction perpendicular to the surface of substrate 1. Moreover, it is preferable in the point of the restraint of reversal of the direction of the magnetization of each of the first ferromagnetic layer 8a and the second ferromagnetic layer 8c due to thermal disturbance without being accompanied by the increase of the coercive force of each of the first ferromagnetic layer 8a and the second ferromagnetic layer 8c that the first ferromagnetic layer 8a and the second ferromagnetic layer 8c are formed to meet the above equation (1). Moreover, it is preferable in the point of the restraint of reversal of the direction of the magnetization of each of the first ferromagnetic layer 8a and the second ferromagnetic layer 8c due to thermal disturbance without being accompanied by the increase of the coercive force of each of the first ferromagnetic layer 8a and the second ferromagnetic layer 8c that the first ferromagnetic layer 8a and the second ferromagnetic layer 8c are formed of the same material to have the same planar shape which is anisotropic, and the thickness $t_1$ and $t_2$ of them are different.

[Third Embodiment]

Figure 10:
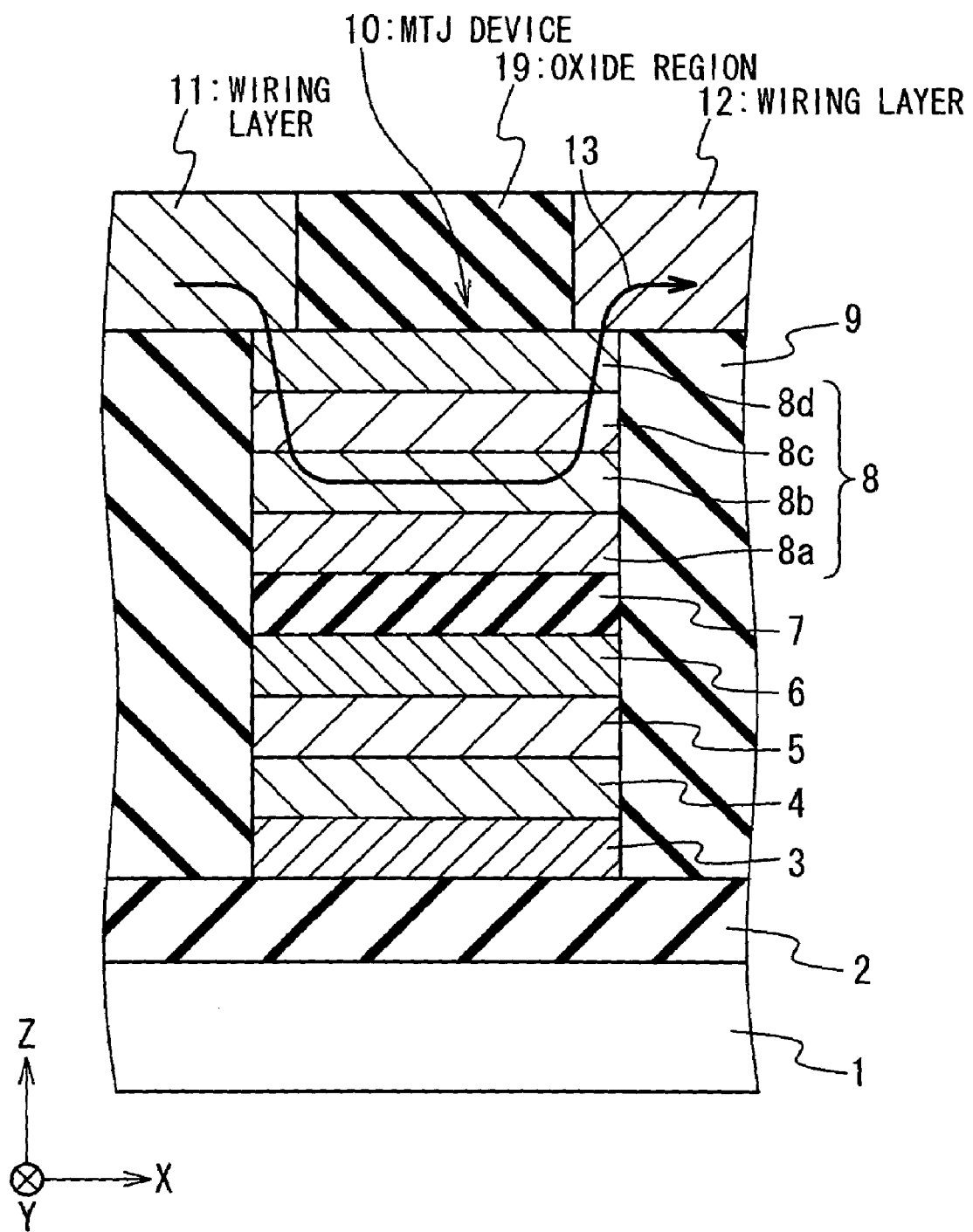
FIG. 10 is a cross sectional view showing the MRAM according to the third embodiment of the present invention.
Figure 11:
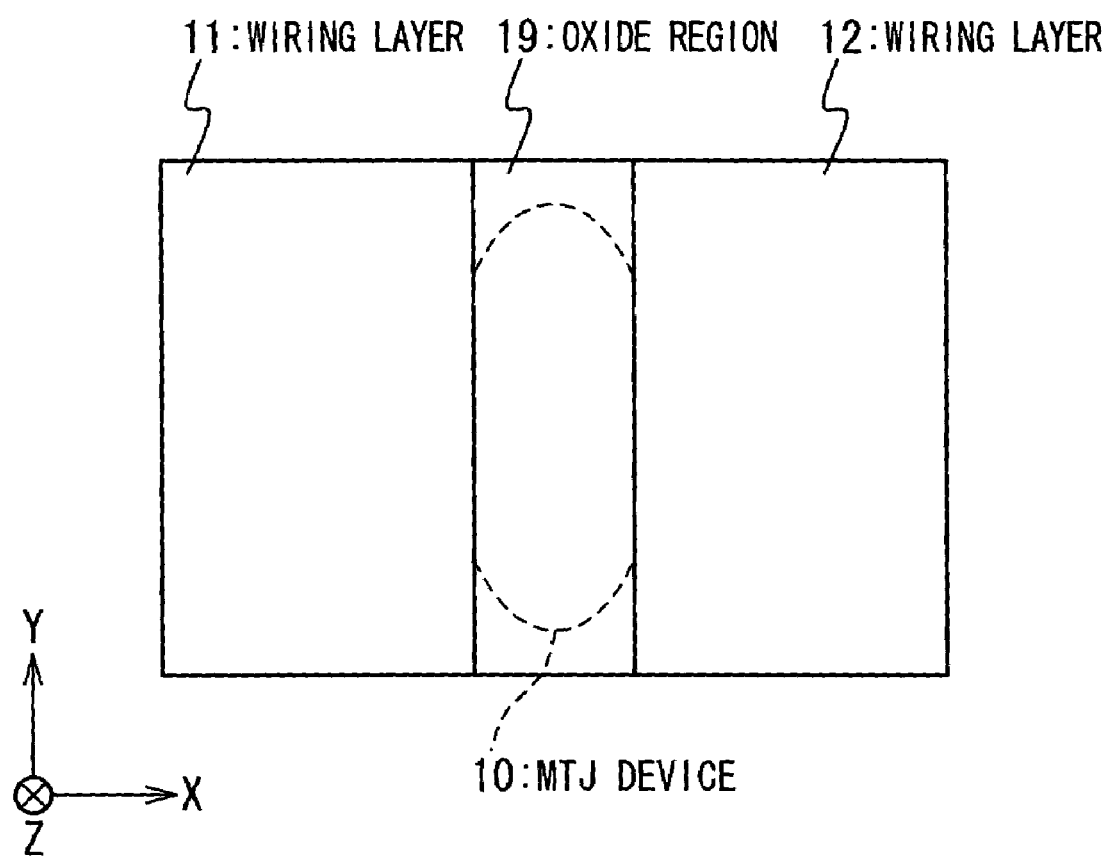
FIG. 11 is a plan view showing the MRAM according to the third embodiment of the present invention.

FIG. 10 shows the MRAM according to the third embodiment of the present invention. In the third embodiment, the wiring layer 11 and the wiring layer 12 are formed of the same conductive material and are separated by an oxide region 19 which is formed of the oxide of the conductive material. As shown in FIG. 11, the wiring layer 11 is coupled to the MTJ device 10 in a part of the surface of the cap layer 8d, and the wiring layer 12 is coupled to the MTJ device 10 in another part of the surface of the cap layer 8d. The ends of the wiring layer 11, the wiring layer 12 and the oxide region 19 are located outside the MTJ device 10, viewing the MTJ device 10 from an above point.

Figure 12:
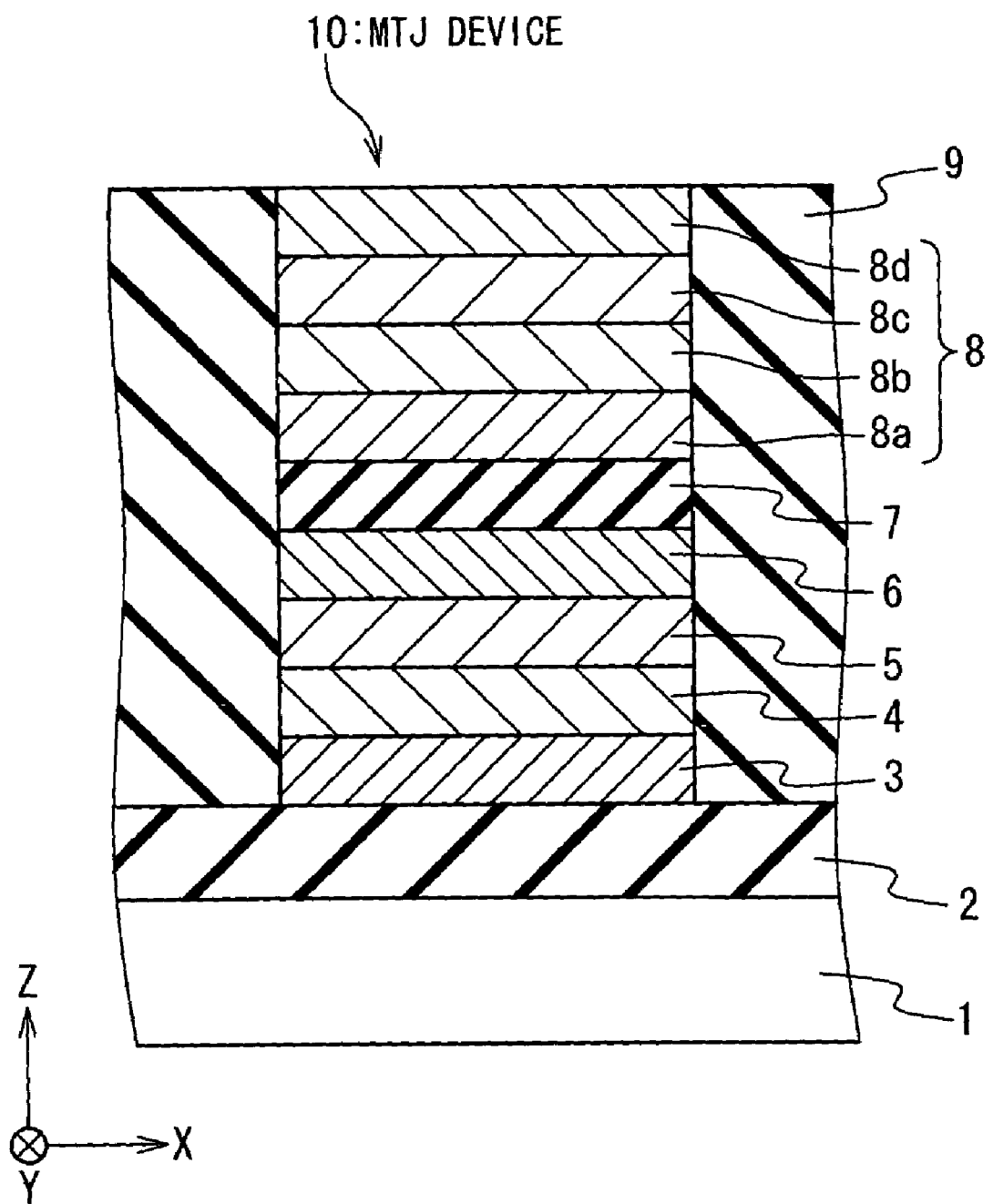
FIGS. 12 and 13 are cross sectional views showing a method of manufacturing the MRAM in the third embodiment.
Figure 13:
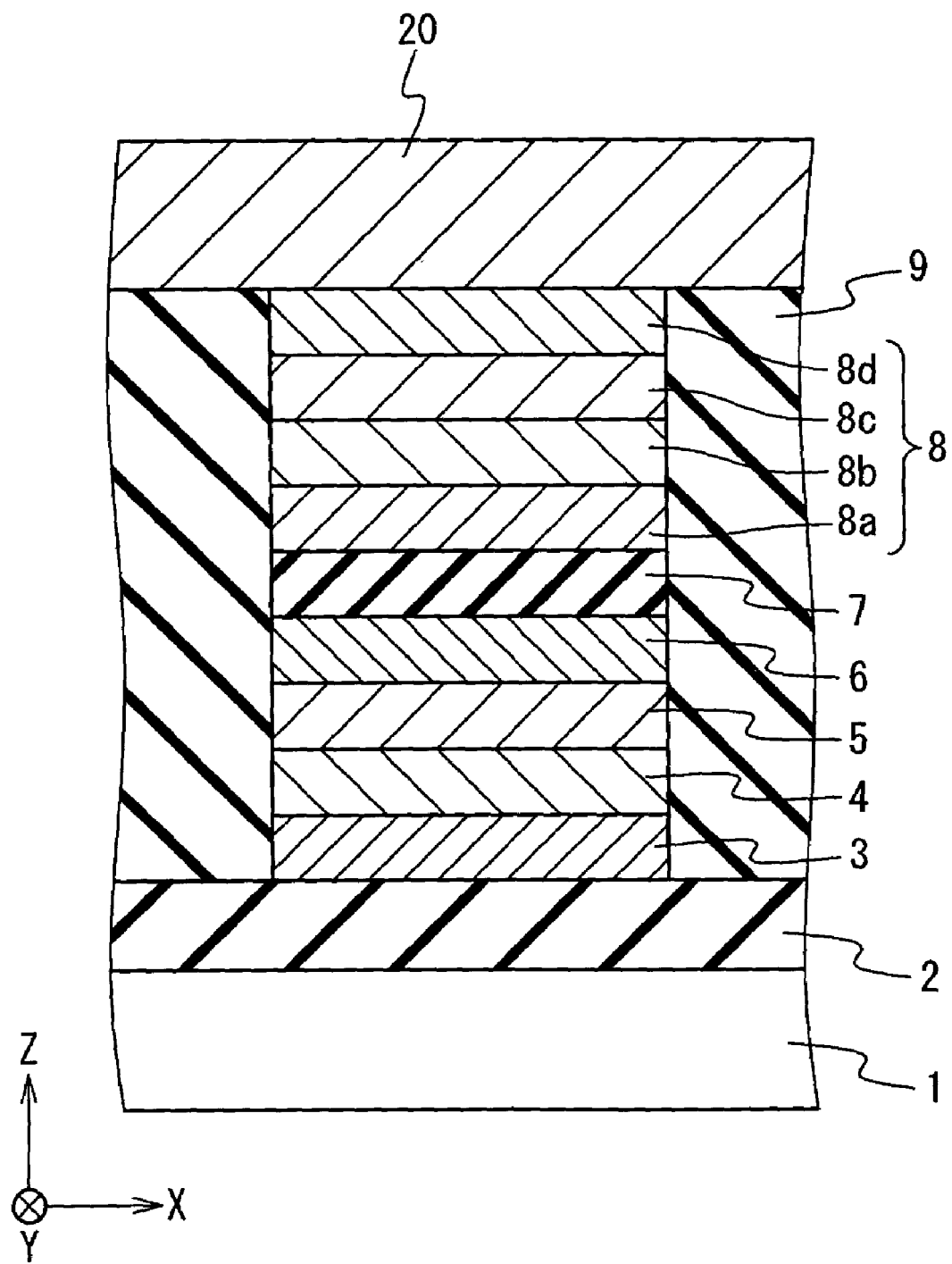

FIGS. 12 and 13 are diagrams showing processes of manufacturing the MRAM in the third embodiment. First, as shown in FIG. 12, the interlayer insulating film 9 and the MTJ device 10 are formed on the surface of the interlayer insulating film 2 covering the substrate 1. Because the processes of forming the interlayer insulating film 9 and the MTJ device 10 are obvious to a person in the art, the details are not described. Subsequently, as shown in FIG. 13, a conductive layer 20 is formed on the surface of the interlayer insulating film 9 and the MTJ device 10. The conductive layer 20 is formed to cover the whole surface of the MTJ device 10, and the ends of conductive layer 20 are located outside the surface of the MTJ device 10. Subsequently, a part of conductive layer 20 which is located on the surface of the MTJ device 10 is selectively oxidized. The selective oxidation of the conductive layer 20 is carried out by forming a hard mask to cover a part of conductive layer 20 other than a part corresponding to the oxide region 19 and then by processing with the oxygen plasma. The structure of the MRAM shown in FIG. 10 is completed through the selective oxidation of the conductive layer 20.

The MRAM of the third embodiment which has such a structure carries out in the same operation as the first embodiment and has the same effect as the first embodiment. That is, in the third embodiment, the direction of magnetizations of the first ferromagnetic layer 8a and second ferromagnetic layer 8c are reversed by the magnetic field generated by the write current flowing through the non-magnetic layer 8b which is provided adjacent to the first ferromagnetic layer 8a and the second ferromagnetic layer 8c. Therefore, it is possible to write data into the MTJ device 10 in a little current in the MRAM of the third embodiment. Moreover, in the MRAM of the third embodiment, because the non-magnetic layer 8b is made thin and the wiring layers 11 and 12 are made thick, the resistance of the path through which the write current flows can be restrained and the stability of the directions of magnetizations of the first ferromagnetic layer 8a and second ferromagnetic layer 8c is improved.

Moreover, the MRAM of the third embodiment is preferable in the point that it is possible to decrease the damage given to the MTJ device 10 during the process of forming the wiring layer 11 and the wiring layer 12. In the first embodiment, when the wiring layer 11 and the wiring layer 12 are formed by using the plasma etching, the cap layer 8d of the MTJ device 10 is exposed to the plasma. On the other hand, in the third embodiment, the cap layer 8d of the MTJ device 10 is not exposed to the plasma while the wiring layer 11 and the wiring layer 12 are formed by using the plasma etching, because the ends of the wiring layer 11, the wiring layer 12 and the oxide region 19 are located outside the MTJ device 10, viewing the MTJ device 10 from an upper position. Therefore, it is possible to effectively decrease the damage given to the MTJ device 10 in the MRAM of the third embodiment.

In the MRAM of the third embodiment, it is effective that the first to fourth modifications described in relation to the first embodiment are applied. First, it is preferable in the point of the reduction of the write current that the direction in which the write current flows is diagonal to the direction of the easy axis of each of the first ferromagnetic layer 8a and the second ferromagnetic layer 8c, viewing from the direction perpendicular to the surface of the substrate 1. Moreover, it is preferable in the point that the reversal of the directions of the magnetizations of the first ferromagnetic layer 8a and the second ferromagnetic layer 8c due to thermal disturbance can be restrained without being accompanied by the increase of the coercive force of each of the first ferromagnetic layer 8a and the second ferromagnetic layer 8c that the first ferromagnetic layer 8a and the second ferromagnetic layer 8c are formed to meet the above equation (1). Moreover, it is preferable in the point that the reversal to the directions of the magnetizations of the first ferromagnetic layer 8a and second ferromagnetic layer 8c due to thermal disturbance can be restrained without being accompanied by the increase of the coercive force of each of the first ferromagnetic layer 8a and the second ferromagnetic layer 8c that the first ferromagnetic layer 8a and the second ferromagnetic layer 8c are formed of the same material to have the same planar shape which has anisotropy, and the first ferromagnetic layer 8a and the second ferromagnetic layer 8c are formed to have different thicknesses $t_1$ and $t_2$.

[Fourth Embodiment]

Figure 14:
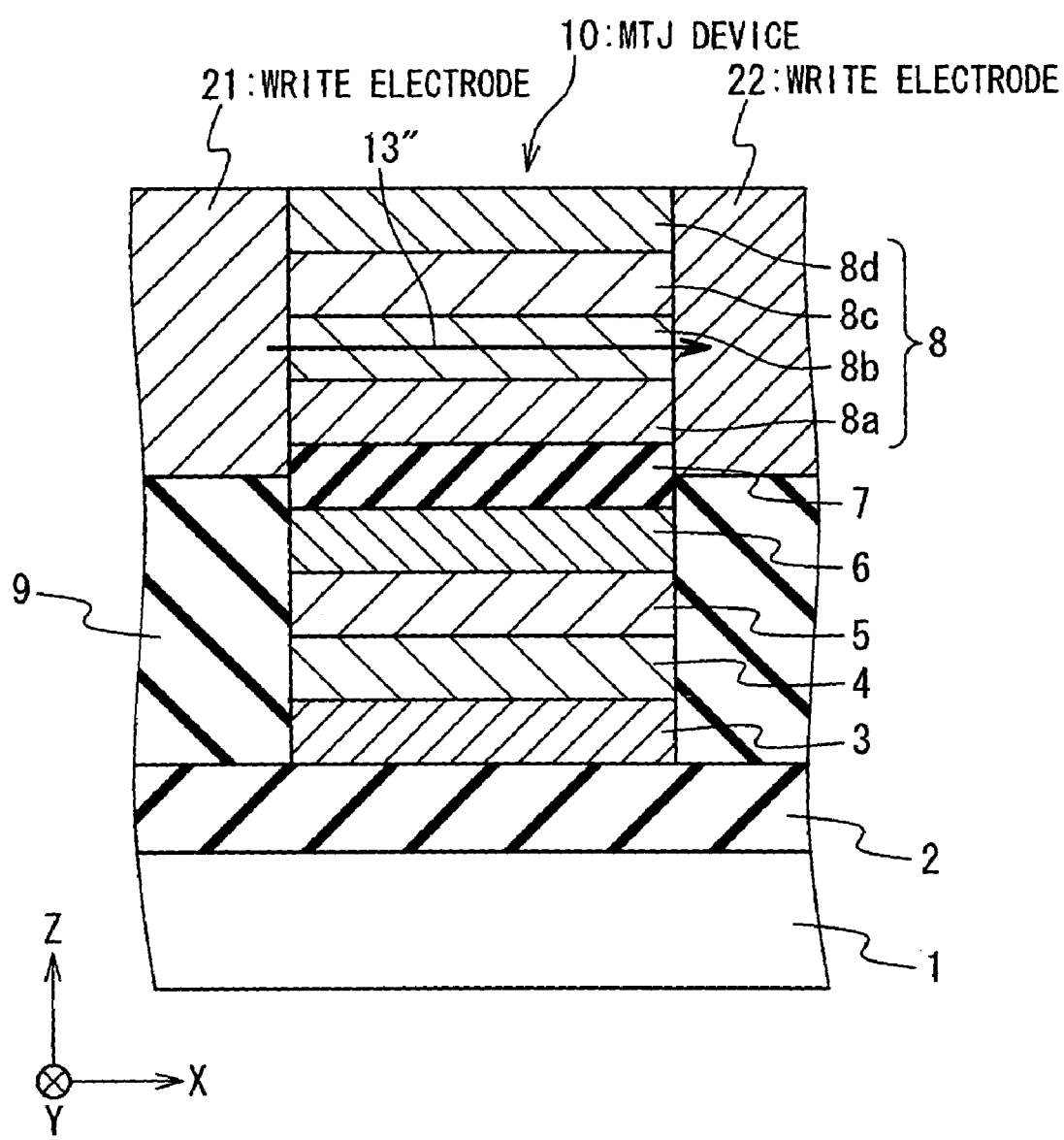
FIG. 14 is a cross sectional view showing the MRAM according to the fourth embodiment of the present invention.

FIG. 14 shows the MRAM according to the fourth embodiment of the present invention. In the fourth embodiment, the supply of the write current to the MTJ device 10 is carried out by using write electrodes 21 and 22 which are coupled to the side of the free ferromagnetic lamination layer 8. The write electrodes 21 and 22 are electrically insulated or isolated from the metal lead layer 3, the seed layer 4, the anti-ferromagnetic layer 5 and the pinned ferromagnetic layer 6 by the tunnel barrier layer 7 and the interlayer insulating film 9. The film thicknesses of the write electrodes 21 and 22 are thicker than the non-magnetic layer 8b of the free ferromagnetic lamination layer 8.

In the fourth embodiment, the read operation of the data from the MTJ device 10 is carried out in accordance with the following processes. A voltage is applied to one of the write electrode 21 and the write electrode 22 and the other is set to a high impedance state. Because the metal lead layer 3 is grounded, the read current flows through the tunnel barrier layer 7 in the MTJ device 10. The magnitude of the read current corresponds to the resistance of the MTJ device 10, i.e., the data stored in the MTJ device 10. The data stored in the MTJ device 10 is determined from the magnitude of the read current.

On the other hand, the write operation of data to the MTJ device 10 is carried out by applying a voltage between the write electrode 21 and the write electrode 22. When the potential of the write electrode 21 is higher than the potential of the write electrode 22, the write current flows from the write electrode 21 to the write electrode 22, as shown in FIG. 14. Because the sheet resistance of the non-magnetic layer 8b is enough smaller than the sheet resistances of the first ferromagnetic layer 8a, the second ferromagnetic layer 8c and the cap layer 8d, the main component of the write current flows through the non-magnetic layer 8b, as shown by the arrow 13" in FIG. 14.

When the write current flows through the non-magnetic layer 8b, the magnetic field generated by the write current is applied to the first ferromagnetic layer 8a and the second ferromagnetic layer 8c provided on and under it. The directions of magnetizations of the first ferromagnetic layer 8a and the second ferromagnetic layer 8c are reversed by this magnetic field.

The structure of FIG. 14 makes it possible to write data into the MTJ device 10 in a little current. The first ferromagnetic layer 8a and the second ferromagnetic layer 8c are contact with the non-magnetic layer 8b, and the distance between the first ferromagnetic layer 8a or the second ferromagnetic layer 8c and the path of the write current to reverse the direction of magnetization are very short. For this reason, a strong magnetic field is applied to the first ferromagnetic layer 8a and the second ferromagnetic layer 8c in a little current. Therefore, the directions of the magnetizations of the first ferromagnetic layer 8a and second ferromagnetic layer 8c can be reversed in a little current, i.e., the write operation of data into the MTJ device 10 can be carried out in the little current.

Moreover, in the structure of FIG. 14, it is possible to restrain the resistance of the path through which the write current flows while the stability of the directions of magnetizations of the first ferromagnetic layer 8a and second ferromagnetic layer 8c is improved. In the structure of FIG. 14, the film thicknesses of the non-magnetic layer 8b, the write electrode 21 and the write electrode 22 can be designed to be independent each other. Therefore, the non-magnetic layer 8b is made thin to shorten the distance between the first ferromagnetic layer 8a and the second ferromagnetic layer 8c, and the write electrode 21 and the writ electrode 22 are made thicker than the non-magnetic layer 8b. If the non-magnetic layer 8b is made thin, the magnetostatic coupling between the first ferromagnetic layer 8a and the second ferromagnetic layer 8c is enhanced, and the reversal of the directions of the magnetizations of the first ferromagnetic layer 8a and second ferromagnetic layer 8c due to external disturbance can be prevented when the write operation is not carried out. Because the non-magnetic layer 8b is made thin so that a current density in the non-magnetic layer 8b increases, it is preferable in the point that it is possible to generate a stronger magnetic field in the same current. On the other hand, the write electrode 21 and the write electrode 22 are made thick so that the resistances of the write electrode 21 and the write electrode 22 can be made small. Therefore, it is possible to decrease the resistance of the path through which the write current flows.

In the MRAM of the fourth embodiment, it is effective that the first to fourth modifications can be applied. First, it is preferable in the point of the decrease of the write current that the direction in which the write current flows is diagonal to the direction of the easy axis of each of the first ferromagnetic layer 8a and the second ferromagnetic layer 8c, viewing from the direction perpendicular to the surface of substrate 1. Moreover, it is preferable in the point that the reversal of the directions of magnetizations of the first ferromagnetic layer 8a and second ferromagnetic layer 8c due to thermal disturbance can be restrained without being accompanied by the increase of the coercive force of each of the first ferromagnetic layer 8a and the second ferromagnetic layer 8c that the first ferromagnetic layer 8a and the second ferromagnetic layer 8c are formed to meet the above equation (1). Moreover, it is preferable in the point that the reversal of the directions of magnetizations of the first ferromagnetic layer 8a and second ferromagnetic layer 8c due to thermal disturbance can be restrained without being accompanied by the increase of the coercive force of each of the first ferromagnetic layer 8a and the second ferromagnetic layer 8c that the first ferromagnetic layer 8a and the second ferromagnetic layer 8c are formed of the same material to have the same planar shape which has an anisotropy and the thicknesses $t_1$ and $t_2$ of the first ferromagnetic layer 8a and the second ferromagnetic layer 8c are different from each other.

The present invention provides the MRAM in which the resistance of the path through which the write current flows can be decreased while the direction of the magnetization of the free ferromagnetic layer is further stabilized in case of a non-write operation.

Also, according to the present invention, the MRAM is provided that the write operation is possible in a small write current.

The invention claimed is:

1. A magnetic random access memory comprising:
    a substrate;
    a MTJ (Magnetic tunnel Junction) device formed above said substrate;
    a first wiring line formed above said substrate; and
    a second wiring line formed above said substrate,
    wherein said MTJ device comprises:
    a pinned ferromagnetic layer which has a pinned magnetization;
    a free ferromagnetic lamination layer; and
    a tunnel barrier layer interposed between said pinned ferromagnetic layer and said free ferromagnetic lamination layer,
    said ferromagnetic lamination layer comprises:
    a first ferromagnetic layer coupled to said tunnel barrier layer and having a reversible first magnetization;
    a second ferromagnetic layer which has and a second magnetization whose direction is opposite to a direction of said magnetization, said second magnetization being reversible; and
    a non-magnetic conductive layer provided between said first ferromagnetic layer and said second ferromagnetic layer and having a sheet resistance lower than sheet resistance of said first ferromagnetic layer and said second ferromagnetic layer,
    a write current is supplied said free ferromagnetic lamination layer through one of said first wiring line and said second wiring line to reverse said first magnetization and said second magnetization, and
    the other of said first wiring line and said second wiring line receives the supplied write current from said free ferromagnetic lamination layer.

2. The magnetic random access memory according to claim 1, wherein a film thickness of said non-magnetic conductive layer is different from at least one of film thicknesses of said first wiring line and said second wiring line.

3. The magnetic random access memory according to claim 2, wherein both of said film thicknesses of said first wiring line and said second wiring line are thicker than the film thickness of said non-magnetic conductive layer.

4. The magnetic random access memory according to claim 1, wherein said first wiring line supplies said write current to said free ferromagnetic lamination layer from a first side of said free ferromagnetic lamination layer, and
    said second wiring line receives said write current from a second side of said free ferromagnetic lamination layer.

5. The magnetic random access memory according to claim 1, wherein said first wiring line supplies said write current to said non-magnetic conductive layer through a current supply surface of said free ferromagnetic lamination layer which is provided on a side opposite to said tunnel barrier layer, and
    said write current flows into said second wiring line from said non-magnetic conductive layer through said current supply surface.

6. The magnetic random access memory according to claim 5, further comprising:
    a local wiring layer covering a whole surface of said free ferromagnetic lamination layer,
    wherein said first wiring line and said second wiring line are formed on said local wiring layer, and
    a sheet resistance of said local wiring layer is higher than the sheet resistances of said non-magnetic conductive layer, said first ferromagnetic layer and said second ferromagnetic layer.

7. The magnetic random access memory according to claim 1, further comprising:
    an oxide region interposed between said first wiring line and said second wiring line,
    said first wiring line, said second wiring line and said oxide region are directly coupled to the surface of said free ferromagnetic lamination layer,
    said first wiring line and said second wiring line are formed of a same conductive material,
    said oxide region is formed of oxide of said conductive material, and
    a structure of said first wiring line, said second wiring line and said oxide region covers a whole surface of said free ferromagnetic lamination layer.

8. The magnetic random access memory according to claim 1, wherein a direction in which said write current flows is diagonal to the direction of each of said first magnetization of said first ferromagnetic layer and said second magnetization of said second ferromagnetic layer, viewing from a direction perpendicular to the surface of said free ferromagnetic lamination layer.

9. The magnetic random access memory according to claim 8, wherein the direction in which said write current flows is substantially perpendicular to a direction of the magnetic field which makes coercive force of each of said first ferromagnetic layer and said second ferromagnetic layer the smallest, viewing from said perpendicular direction.

10. The magnetic random access memory according to claim 1, wherein said first ferromagnetic layer and said second ferromagnetic layer are formed to meet the following equation:

$$M1*V1=M2*V2$$

wherein M1 and M2 are magnitudes of magnetization of said first ferromagnetic layer and said ferromagnetic layer, respectively and V1 and V2 are volumes of said first ferromagnetic layer and said second ferromagnetic layer, respectively.

11. The magnetic random access memory according to claim 10, wherein planar shapes of said first ferromagnetic layer and said second ferromagnetic layer are substantially same,
    said M1 and said M2 are substantially equal, and
    thicknesses of said first ferromagnetic layer and said second ferromagnetic layer are substantially same.

12. The magnetic random access memory according to claim 1, wherein said first ferromagnetic layer and said second ferromagnetic layer are formed of same material,
    planar shapes of said first ferromagnetic layer and said second ferromagnetic layer are same, said planar shapes of said first ferromagnetic layer and said second ferromagnetic layer have an anisotropy, and said first ferromagnetic layer and said second ferromagnetic layer are different from each other in thickness.

13. The magnetic random access memory comprising a plurality of memory cell, wherein each of said plurality of memory cells comprises:

an MTJ (magnetic tunnel junction) device;

a MISFET (metal insulator semiconductor field effect transistor);

a first wiring line; and a second wiring line, said MTJ device comprises:

a pinned ferromagnetic layer which has a fixed pinned magnetization;

a free ferromagnetic lamination layer; and a tunnel barrier layer interposed between said pinned ferromagnetic layer and said free ferromagnetic lamination layer, said free ferromagnetic lamination layer comprises:

a first ferromagnetic layer coupled to said tunnel barrier layer and having a first magnetization which is reversible;

a second ferromagnetic layer which has a second magnetization whose direction is opposite to a direction of said magnetization, the direction of said second magnetization being reversible; and a non-magnetic conductive layer put between said first ferromagnetic layer and said second ferromagnetic layer and having a sheet resistance lower than that of each of said first ferromagnetic layer and said second ferromagnetic layer, said first wiring line said second wiring line are coupled to said free ferromagnetic lamination layer, said MISFET is connected with said free ferromagnetic lamination layer through said second wiring line, one of said first wiring line and said second wiring line supplies a write current to said free ferromagnetic lamination layer to reverse said first magnetization and said second magnetization, and the other of said first wiring line and said second wiring line receives said write current from said free ferromagnetic lamination layer.

14. The magnetic random access memory according to claim 13, wherein a film thickness of said non-magnetic conductive layer is thin, and a film thickness of at least one of said first wiring line and said second wiring line is thick.

15. The magnetic random access memory according to claim 13, wherein a direction in which said write current flows is diagonal to a direction of said first magnetization of said first ferromagnetic layer and a direction of said second magnetization of said second ferromagnetic layer, viewing from a direction perpendicular to a surface of said free ferromagnetic lamination layer.

16. The magnetic random access memory according to claim 13, wherein a direction which said write current flows is substantially perpendicular to a direction of a magnetic field which makes coercive force of each of said first ferromagnetic layer and said second ferromagnetic layer the smallest, viewing from said perpendicular direction.

17. A magnetic random access memory comprising:

a pinned ferromagnetic layer having a pinned magnetization;

a free ferromagnetic lamination layer;

a tunnel barrier layer interposed between said pinned ferromagnetic layer and said free ferromagnetic lamination layer; and a current supply section, wherein said free ferromagnetic lamination layer comprises:

a first ferromagnetic layer coupled to said tunnel barrier layer and having a first magnetization which is reversible;

a second ferromagnetic layer having a second magnetization whose direction is opposite to the direction of said first magnetization, the direction of said second magnetization being reversible; and a non-magnetic conductive layer put between said first ferromagnetic layer and said second ferromagnetic layer, said current supply section supplies a current to said free ferromagnetic lamination layer to reverse directions of said first magnetization and said second magnetization, said current passes through said second ferromagnetic layer to flow into said non-magnetic conductive layer, flows through said non-magnetic conductive layer in a direction which has a direction component parallel to the surface of said non-magnetic conductive layer, and flows out from said free ferromagnetic lamination layer through said non-magnetic conductive layer and said second ferromagnetic layer.

* * * * *